(12) United States Patent
Yamada et al.

(10) Patent No.: US 6,557,607 B2
(45) Date of Patent: May 6, 2003

(54) APPARATUS FOR MANUFACTURING MICRO-STRUCTURE

(75) Inventors: Takayuki Yamada, Nakai-machi (JP); Mutsuya Takahashi, Nakai-machi (JP); Masaki Nagata, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/791,571

(22) Filed: Feb. 26, 2001

(65) Prior Publication Data

US 2001/0042598 A1 Nov. 22, 2001

Related U.S. Application Data

(62) Division of application No. 09/064,056, filed on Apr. 22, 1998, now Pat. No. 6,245,249.

(30) Foreign Application Priority Data

May 1, 1997 (JP) ............................................. 9-114071

(51) Int. Cl.$^7$ .................... B32B 31/00; B32B 31/18
(52) U.S. Cl. ...................... 156/389; 156/350; 156/382; 156/510; 156/512
(58) Field of Search ................................. 156/389, 350, 156/353, 580, 235, 263, 264, 512, 510, 511; 216/33; 204/192.34; 134/1.1, 42

(56) References Cited

U.S. PATENT DOCUMENTS

| | | | |
|---|---|---|---|
| 4,752,352 A | | 6/1988 | Feygin |
| 5,015,312 A | | 5/1991 | Kinzie |
| 5,071,503 A | * | 12/1991 | Berman ....................... 156/250 |
| 5,203,944 A | | 4/1993 | Prinz et al. |
| 5,354,414 A | | 10/1994 | Feygin |
| 5,514,232 A | | 5/1996 | Burns |
| 5,534,103 A | * | 7/1996 | Yano et al. ............... 156/272.2 |
| 5,647,966 A | | 7/1997 | Uriu et al. |
| 5,725,914 A | * | 3/1998 | Opower ................... 204/192.1 |
| 5,997,681 A | * | 12/1999 | Kinzie ........................ 156/256 |
| 6,025,110 A | | 2/2000 | Nowak |

FOREIGN PATENT DOCUMENTS

| | | |
|---|---|---|
| JP | A-54-124853 | 9/1979 |
| JP | 62-211135 A | 7/1987 |
| JP | A-6-190929 | 7/1994 |
| JP | A-329188 | 12/1995 |
| JP | 07-329191 A | 12/1995 |
| JP | 08-057967 A | 3/1996 |
| JP | A-8-127073 | 5/1996 |
| WO | WO 94/29128 | 12/1994 |

OTHER PUBLICATIONS

Nikkan Kogyo Shinbun, Daily Industrial Newspaper, Apr. 19, 1996, "Silicon Wafer, Sucess in surface activated bonding at room temperature".
"Optronics", No. 4, pp. 103–108, 1996.
Maruo et al, "Two Photon–Absorbed Photopolymerization for Three–Dimensional Microfabrication", Department of Applied Physics, Osaka University, date unknown.

\* cited by examiner

Primary Examiner—Mark A. Osele
Assistant Examiner—Sue A. Purvis
(74) Attorney, Agent, or Firm—Oliff & Berridge PLC

(57) ABSTRACT

A substrate on which a plurality of thin films having a plurality of cross-sections corresponding to the cross-section of a micro-structure are formed is placed on a substrate holder. The substrate holder is elevated to bond a thin film formed on the substrate to the surface of a stage, and by lowering the substrate holder, the thin film is separated from the substrate and transferred to the stage side. The transfer process is repeated to laminate a plurality of thin films on the stage and to form the micro-structure. Accordingly, there are provided a micro-structure having high dimensional precision, especially high resolution in the lamination direction, which can be manufactured from a metal or an insulator such as ceramics and can be manufactured in the combined form of structural elements together, and a manufacturing method and an apparatus thereof.

3 Claims, 25 Drawing Sheets

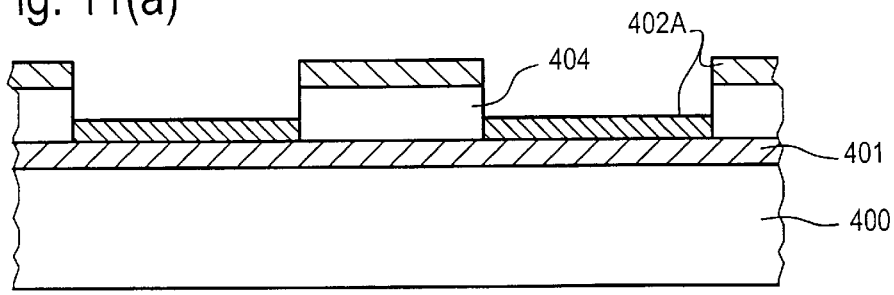
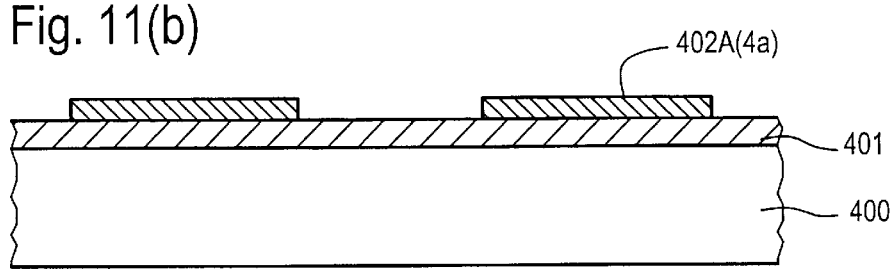
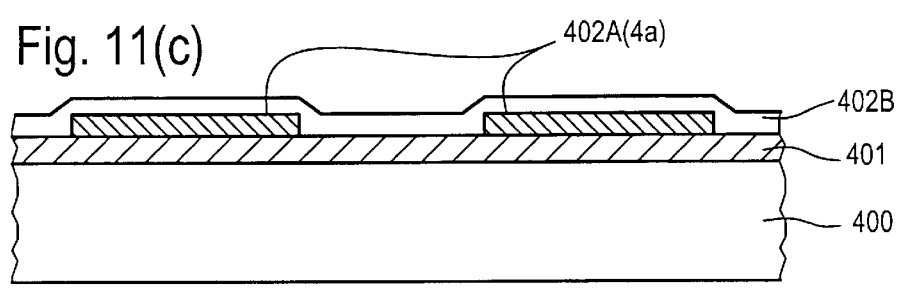
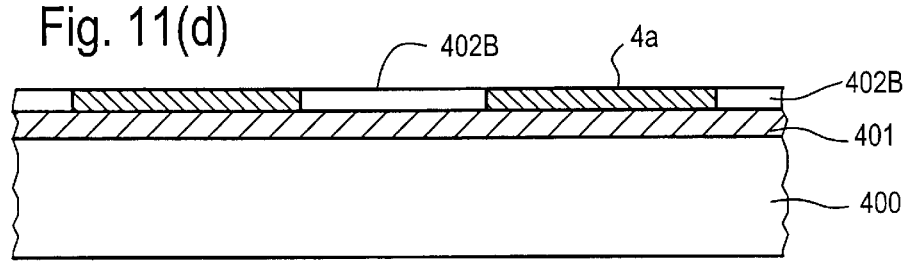
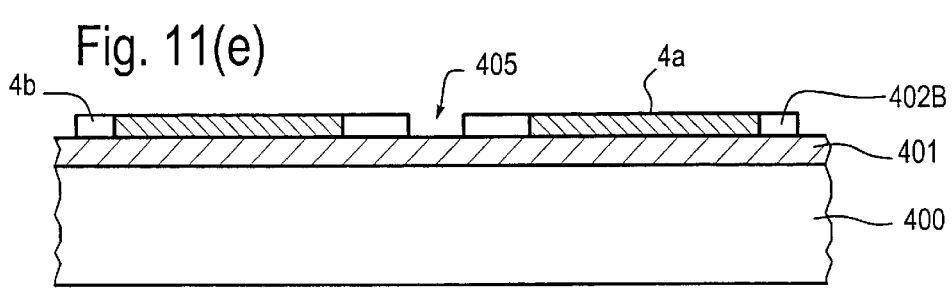

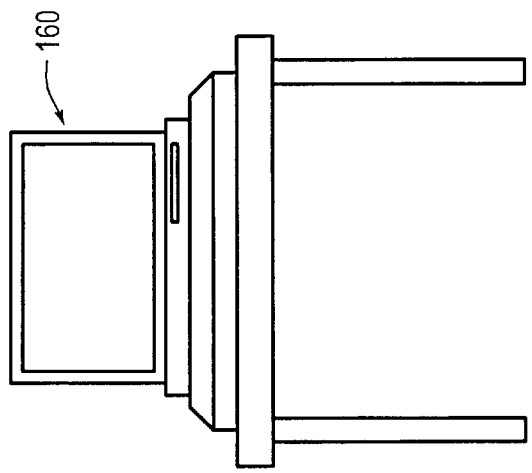
Fig. 28
Prior Art
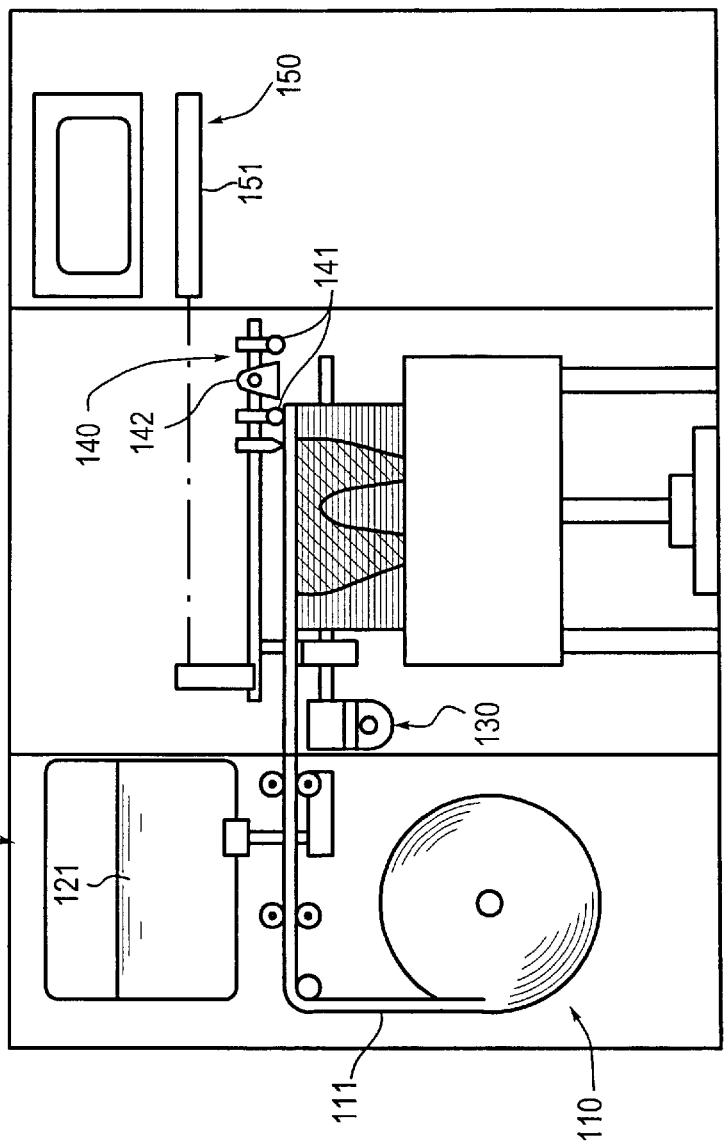

APPARATUS FOR MANUFACTURING MICRO-STRUCTURE

This is a Division of application Ser. No 09/064,056 filed Apr. 22, 1998 now U.S. Pat. No. 6,245,249. The entire disclosure of the prior application(s) is hereby incorporated by reference herein in its entirety.

BACKGROUND OF THE INVENTION

1. Field of the Invention

This invention relates to micro-structures such as micro-gears, micro-optical parts, or molds for molding these micro-products manufactured by rapid prototyping, and a manufacturing method and an apparatus thereof, and more particularly relates to micro-structures obtained by laminating thin films consisting of a metal or an insulator which are patterned into sectional forms, and a manufacturing method and an apparatus thereof.

2. Description of Related Art

Rapid prototyping has been rapidly popularized recently as a method for molding three dimensional complex form products designed with the aid of a computer within a short time. Three dimensional products manufactured by rapid prototyping are used as parts models (prototype) of various apparatus to predict the suitability of operation or form of parts. This method has been mainly applied to relatively large parts having a size of several cm or larger, however, recently it has been desired to apply this method to manufacture micro-parts formed by precise working such as micro-gears and micro-optical parts. Conventional methods for manufacturing such micro-parts described hereinafter have been known.

(1) Stereolithography (referred to as "conventional example 1" hereinafter)
(2) Selective laser sintering (referred to as "conventional example 2" hereinafter)
(3) Sheet lamination (referred to as "conventional example 3" hereinafter)
(4) Method using thin films as starting material (referred to as "conventional example 4" hereinafter)

(Convention example 1)

FIG. 26 shows the conventional example 1 namely the stereolithography. In the "stereolithography", photo-curable resin 100, which is hardened by irradiation of light such as ultraviolet rays, is filled in a tank 101, a laser beam 102 scans on the surface of the tank 101 two-dimensionally to draw a form corresponding to the cross-sectional data of a three-dimensional product to harden the resin layer 100a, then a stage 103 is lowered by one layer, and this process is repeated layer by layer to form the three dimensional product comprising a plurality of resin layers 100a. Stereolithography is presented by Ikuta, Nagoya University, in a literature "OPTRONICS, 1996, No. 4, p 103". According to the special stereolithography, planar form precision of 5 $\mu$m and resolution in the lamination direction of 3 $\mu$m can be attained by optimization of exposure conditions and optimization of resin characteristics. Stereolithography is also presented by Kawata, Osaka University, in a literature "Proceedings of MEMS 97, p 169". According to this stereolithography, planar form precision of 0.62 $\mu$m and resolution in the lamination direction of 2.2 $\mu$m can be attained by utilizing a principle of two-photon absorption phenomenon.

(Conventional example 2)

FIG. 27 shows the conventional example namely selective laser sintering. In the "selective laser sintering", powder 104 is laid to form a thin layer (powder layer) 104a a laser beam 102 is applied to the powder layer 104a to form a thin layer of a desired form, and by repeating this process a three dimensional sintered product composed of a plurality of powder layers 104a is formed. According to the selective laser sintering, a three dimensional product not only of resin but also of ceramics and metals can be formed.

(Conventional example 3)

FIG. 28 shows a manufacturing apparatus used in the conventional example 3, namely the sheet lamination disclosed in Japanese Published Unexamined Patent Publication No. Hei 6-190929. In this manufacturing apparatus, when a plastic film 111 is supplied from a film feeding device 110, an adhesive coating device 120 coats photo-curable adhesive 121 evenly on the underside of the plastic film 111 to form an adhesive layer, a negative pattern exposure device 130 exposes an area of the adhesive layer excepting the area corresponding to the cross sectional form of a micro-structure to form the hardened portion and the uncured portion, this is pressed down by a press roller 141 of a photo-curing laminating device 140, the uncured portion is hardened by the light from a light source 142 and bonded to the lower plastic film 111. The rear end of the plastic film 111 is cut by a laser beam from a $CO_2$ laser source 151, and the border of the unnecessary area of the uppermost plastic film 111 is removed by the laser. This process is repeated layer by layer to form a micro-structure. In FIG. 28, 160 represents a work device for controlling this apparatus. According to the sheet lamination, a micro-structure comprising plastic sheets is obtained.

(Conventional example 4)

FIG. 29 shows the conventional example 4, namely a manufacturing method using thin films as starting material disclosed in Japanese Published Unexamined Patent Publication No. Hei 8-127073. In this manufacturing method, as shown in the drawing (a), a photosensitive resin film 171 is formed on a substrate 170, and two processes, namely a process for forming an exposed portion 171a by exposing on an area of a desired pattern as shown in the drawing (b) and a process for forming an intermediate film 172 which prevents the resin film 171 from being mixed and prevents exposure of the lower layer, are repeated to form a multilayer structure composed of the resin film 171 and intermediate film 172 as shown in the drawing (c), and then the exposed portion 171a shown in the drawings (b) and (c) is selectively removed by dipping it in a resin developing solution and thus a three dimensional micro-structure as shown in drawing (d) is obtained. According to this manufacturing method, the resolution in the lamination direction of $\mu$m order can be attained because spin coating is applied to the resin film 171 and intermediate film 172.

However, according to the conventional example 1, namely stereolithography, this method is disadvantageous in that the resolution in the lamination direction of 1 $\mu$m or smaller and the film thickness precision of 0.1 $\mu$m or smaller, which is required to manufacture micro-gears and micro-optical parts, cannot be attained. In detail, because an incident light applied perpendicularly onto the layer for hardening the starting material (photosensitive resin) is used, the incident light penetrates perpendicularly from the surface through the layer with decreasing intensity due to absorption, and the intensity decreases to the level of the threshold value required for curing. The layer thickness corresponding to the threshold value is the thickness of one layer, but because of dispersion of the incident light intensity, variation of the incident light intensity with time, and dispersion of the absorption coefficient of the starting material, it is difficult to obtain high resolution.

In addition, full cure process is applied to harden completely after forming because photosensitive resin is used, in the full cure process the product shrinks 1% through several %, the shrinkage is disadvantageous and causes significant deterioration of the precision.

Furthermore, this method can be applied to only micro-structures made of relatively soft photosensitive resin, therefore, if a micro-structure is required to be made of a hard material such as a metal, the only way to manufacture the product is the molding by electroforming or injection molding using a mold of this resin. The requirement of such process is disadvantageous.

According to the conventional example 2, namely the selective laser sintering, the resolution in the lamination direction is poor because an incident light applied perpendicularly onto the layer is used as in the conventional example 1, and the shrinkage in full cure process causes deterioration of precision, and furthermore the method is disadvantageous in that a transfer process is required to manufacture micro-structures made of a hard material such as metal.

According to the conventional example 3, namely the sheet lamination, the sheet thickness is the determinant factor of the resolution in the lamination direction, the lower limit is about several tens μm in view of usable sheet thickness, and it is difficult to realize the resolution in the lamination direction of 1 μm.

According to the conventional example 4, namely the manufacturing method using thin films as starting material, the intermediate film (for example A1) is required in order to prevent exposure of the lower layer because an incident light applied approximately perpendicularly is used in the exposure process, this method is disadvantageous in the resolution per one layer. Though a method in which two types of photosensitive resins of different sensitive wavelengths and different solubility in solvents are laminated alternately, the respective photosensitive resins are exposed, and finally developed to form a three dimensional product in order to omit the use of the intermediate film, is disclosed in the patent, because this method is still disadvantageous in that the adhesion between resins of different solubility in solvents is poor, the strength of a completed product is low, and the dimensional precision is poor due to swelling of the photosensitive resin in the final development process. Furthermore, it is impossible to apply this method directly to hard material such as metals and insulators as in the above-mentioned stereolithography because photosensitive resin is used, and the only way is a method in which a product is used as a mold.

Accordingly, it is an object of the present invention to provide micro-structures of high dimensional precision and, particularly, high resolution in the lamination direction and a manufacturing method and an apparatus thereof.

It is another object of the present invention to provide micro-structures which are formed directly of metals or insulators such as ceramics and a manufacturing method thereof and an apparatus therefor.

It is yet another object of the present invention to provide micro-structures which can be formed together from a plurality of combined structural elements and a manufacturing method and an apparatus thereof.

SUMMARY OF THE INVENTION

To achieve the above-mentioned object, the present invention provides a micro-structure comprising a plurality of laminated thin films having prescribed two-dimensionally patterned forms.

To achieve the above-mentioned object, the present invention provides a manufacturing method of micro-structures composed of a first step for forming a plurality of thin films having prescribed two-dimensionally patterned forms on a substrate, and a second step for forming the micro-structure by separating the plurality of thin films from the substrate and subsequently by laminating and bonding the plurality of thin films on a stage.

To achieve the above-mentioned object, the present invention provides a manufacturing method of micro-structures including;

a first step for forming a plurality of first thin films having a prescribed two-dimensional pattern on a substrate, and forming a plurality of second thin films composed of different material from that of the first thin films and having the same film thickness as the first thin film to form a plurality of composite thin films comprising the first thin films and the second thin films, a second step for forming a laminate including a micro-structure by laminating and bonding the plurality of composite thin films on a stage, and a third step for removing the first thin films or the second thin films out of the substrate to obtain the micro-structure.

To achieve the above-mentioned object, the present invention provides a manufacturing method of micro-structures including;

a first step for forming a thin film respectively on a plurality of substrates and forming a plurality of latent images having a prescribed two-dimensional pattern on each thin film formed on the plurality of substrates, a second step for bonding the thin films each other on which the latent images are formed, a third step for removing one substrate out of a pair of substrates having the thin films bonded each other, a fourth step for laminating a plurality of thin films by repeating the second step and the third step, and a fifth step for developing the latent images out of the plurality of laminated thin films.

To achieve the above-mentioned object, the present invention provides a manufacturing apparatus of micro-structures provided with;

a substrate holder having a substrate on which a plurality of thin films are formed thereon having a prescribed two-dimensional pattern provided in a vacuum chamber, a stage disposed facing the substrate holder in the vacuum chamber for supporting a three-dimensional structure formed by laminating the plurality of thin films, a moving means for transferring at least either of the substrate holder and the stage to position the stage successively on the plurality of thin films, and a control means for controlling the moving means to separate the plurality of thin films from the substrate, to laminate and bond the plurality of thin films on the stage so as to form a micro-structure.

BRIEF DESCRIPTION OF THE DRAWINGS

FIG. 6 is a set of diagrams.

FIG. 10 is a set of diagrams.

FIG. 11 is a set of diagrams, FIGS. 11(a) through (e) show the film deposition and patterning process in accordance with the second embodiment.

FIG. 15 is a set of diagrams.

FIG. 17 is a set of diagrams.

FIG. 24 is a set of diagrams.

FIG. 25 is a set of diagrams.

FIG. 28 is a diagram for illustrating a manufacturing apparatus in accordance with the sheet lamination of the conventional example 3.

FIG. 29 is a set of diagrams.

DETAILED DESCRIPTION OF THE PREFERRED EMBODIMENTS

Figure 1:
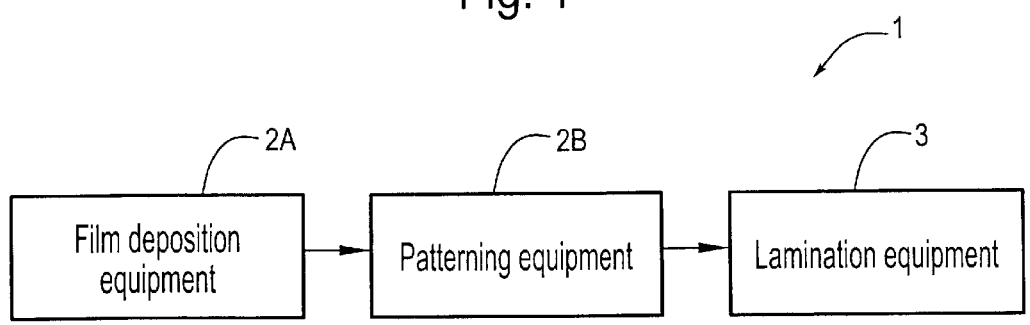
FIG. 1 is a block diagram for illustrating a manufacturing system in accordance with the first embodiment of the present invention.

FIG. 1 shows a manufacturing system of micro-structures in accordance with the first embodiment of the present invention. The structure of this manufacturing system 1 comprises a film deposition equipment 2A for depositing a thin film on a substrate, a patterning equipment 2B for patterning a pattern on the thin film formed by the film deposition equipment 2A corresponding to cross-sectional forms of an object micro-structure, and a lamination equipment 3 for laminating a plurality of patterned thin films by surface activated bonding.

The film deposition equipment 2A controls excellently the film thickness of a film deposited on a substrate such as an Si wafer, a quartz substrate, or a glass substrate (for example, Corning 7059) in a thickness range from sub $\mu$m through several $\mu$m, and forms a thin film by, for example, vacuum vapor deposition such as electron beam deposition, resistance heating vapor deposition, sputtering, or chemical vapor deposition (CVD), or spin coating which gives a film with even thickness through the entire substrate. By applying vacuum vapor deposition or spin coating, a film with a thickness of 0.1 through 10 $\mu$m is deposited with a film thickness precision of 1/10 the film thickness or smaller.

The film deposition equipment 2A previously forms a releasable releasing layer on the surface of a substrate prior to deposition or coating of a thin film. The releasing layer may be a thin film of thermal oxide or fluorine-containing resin formed by vapor deposition or coating on the surface of a substrate, or may be formed by a method that the substrate surface is exposed to discharge in a gas containing fluorine to fluoridize the substrate surface. The releasability is enhanced by forming a thin film containing fluorine or fluoridation.

The patterning equipment 2B forms a plurality of thin films having forms respectively corresponding to each cross-sectional form of a micro-structure by removing unnecessary portions or circumference together using a patterning method for patterning with a planer precision within 0.1 $\mu$m, for example, photolithography, focused ion beam method (FIB), or electron beam lithography. By applying lithography, the planar precision of sub $\mu$m is obtained, and the productivity is enhanced. By applying FIB method and electron beam lithography, the planar precision of sub $\mu$m is obtained, and a film is patterned without using a photo-mask because an arbitrary form is drawn by beam scanning, hence the time for manufacturing of photomasks is saved. In the case of the electron beam lithography, electron beam resist which is sensitive to an electron beam is used as the resist. In the first embodiment, unnecessary portions are removed by photolithography.

Figure 2:
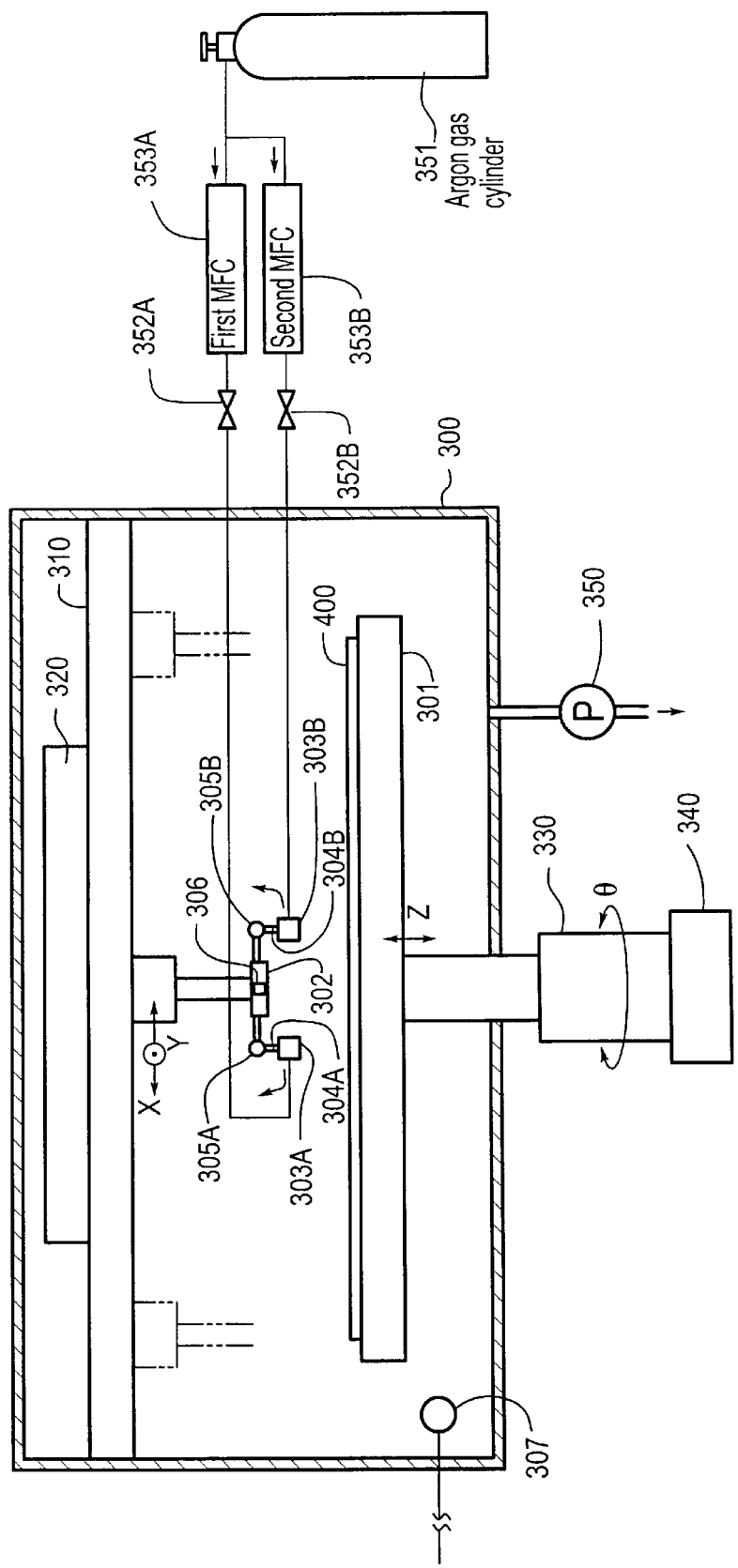
FIG. 2 is a schematic structural diagram of a lamination equipment in accordance with the first embodiment.

FIG. 2 shows a schematic structure of the lamination equipment 3. The lamination equipment 3 is provided with a vacuum chamber 300 in which a lamination process is performed, and in the vacuum chamber 300, a substrate holder 301 on which a substrate 400 is placed and fired, a stage 302 to which a thin film formed on the substrate 400 is transferred, the first FAB source 303A for FAB (Fast Atom Bombardment) of the stage 302 side and the second FAB source 303B for FAB of the substrate 400 side both attached to the stage 302, the first and second withdrawing motors 305A and 305B for withdrawing the first and second FAB sources 303A and 303B by rotating arms 304A and 304B about 90° after FAB, a mark detection unit 306 for detecting an alignment mark on the substrate 400 as a microscope mounted on the stage 302, a vacuum gauge 307 for measuring the degree of vacuum in the vacuum chamber 300, an X-axis table 310 for moving the stage 302 in the X-axis direction (horizontal direction in FIG. 2) using an X-axis motor 311 (refer to FIG. 3) and for detecting the position of the stage 302 on the X-axis using an X-axis position detection unit 312 (refer to FIG. 3), and a Y-axis table 320 for moving the stage 302 in the Y-axis direction (in the direction perpendicular to the page plane) using a Y-axis motor 321 (refer to FIG. 3) and for detecting the position of the stage 302 on the Y-axis are provided. Herein, "FAB" means a treatment that, for example, argon gas which is accelerated by a high voltage of about 1 kV is applied onto the surface of a material as an atom beam to remove oxide film and impurities on the material surface and to clean the surface. In this embodiment, the FAB irradiation conditions are varied depending on material to be treated, in detail, the acceleration voltage is varied in a range from 1 through 1.5 kV, and irradiation time is varied in a range from 1 to 10 minutes.

The stage 302 consists of a metal such as stainless steel or aluminum, and a sacrifical layer is formed previously on the surface in order to separate the micro-structure easily from the stage 302 the micro-structure comprising a plurality of thin films laminated on the stage 302. Material used for the sacrificial layer is selected depending on the material of the micro-structure. In detail, for the micro-structure made of a metal such as aluminum, copper or nickel is selected as the material of the sacrificial layer, and in this case, a copper or nickel layer with a thickness of, for example, about 5 μm is formed on the surface of the stage 302 by plating. For the micro-structure which comprises thin films of an insulator, namely ceramics such as alumina, aluminum nitride, silicon carbide, or silicon nitride, aluminum is selected as the material of the sacrificial layer, and in this case, an aluminum layer is formed on the surface of the stage 302 by vacuum vapor deposition. By removing only the sacrifice layer after completion of thin film lamination, the micro-structure is separated easily from the stage 302 without an external force applied to the micro-structure.

The lamination equipment 3 is provided with a Z-axis table 330, a θ table 340, a vacuum pump 350, an argon gas cylinder 351, and the first and second flow rate controllers (MFC) 353A and 353B. The Z-axis table 330 is served for moving the substrate holder 301 in the Z-axis direction (vertical direction in FIG. 2) to the outside of the vacuum chamber 300 using a Z-axis motor 331 (refer to FIG. 3), for pressing the thin film onto the stage 302 side with a pressure of 5 kgf/cm² or higher for 1 through 10 minutes, and for detecting the position of the substrate holder 301 on the Z-axis using a Z-axis position detection unit 332 (refer to FIG. 3). The θ table 340 is served for rotating the substrate holder 301 round the Z-axis using a θ motor 341 for alignment adjusting, and for detecting the angular position in the θ-direction of the substrate holder 301 using a θ position detection unit 342 (refer to FIG. 3). The vacuum pump 350 is served for evacuating the internal of the vacuum chamber 300 to a vacuum. The argon gas cylinder 351 contains argon gas. The first and second mass flow controllers (MFC) 353A and 353B are served for controlling the flow rate of argon gas supplied from the argon gas cylinder 351, and for supplying argon gas to the first and second FAB sources 303A and 303B through the first and second solenoid valves 352A and 352B.

Figure 3:
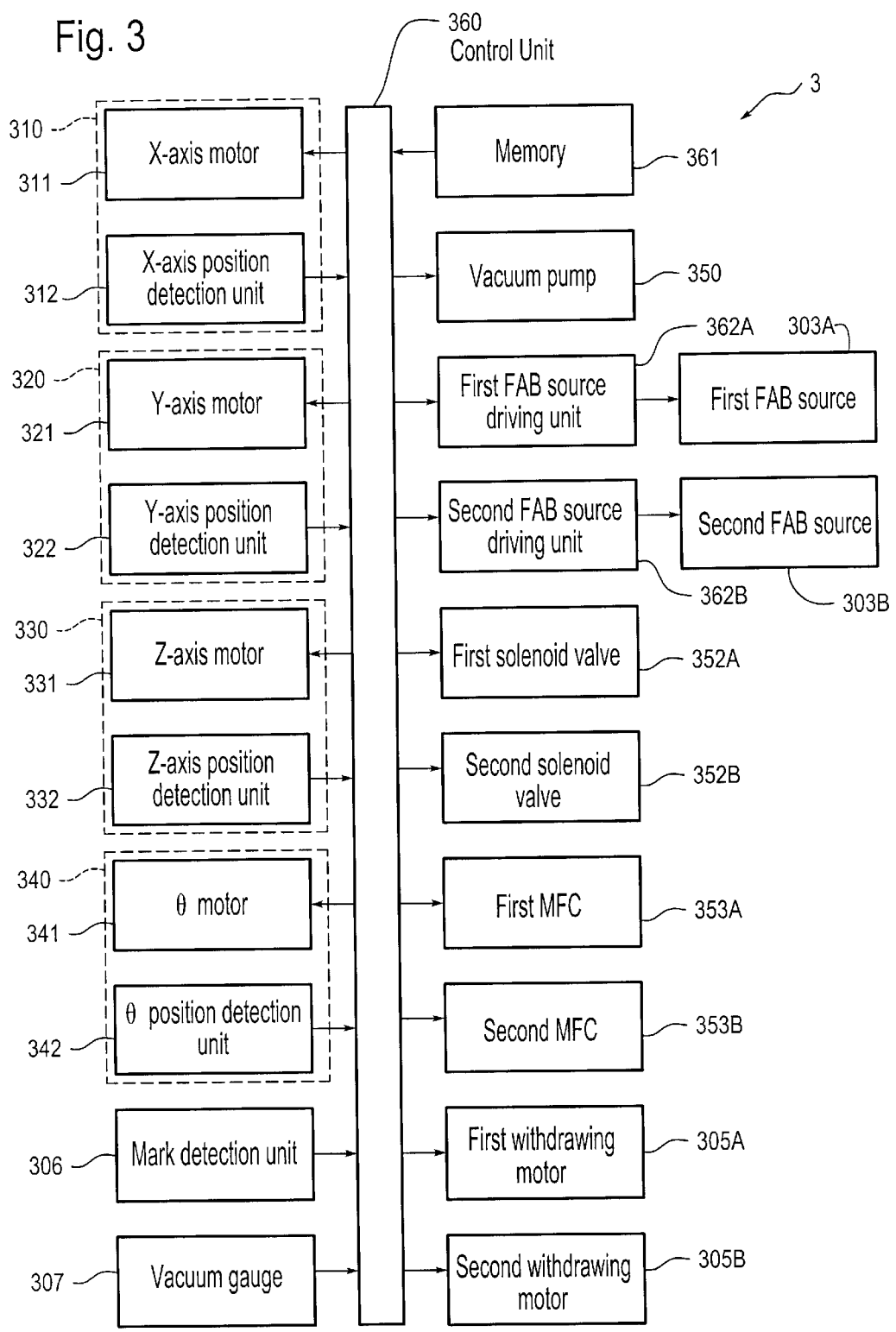
FIG. 3 is a block diagram for illustrating a control system of the lamination device in accordance with the first embodiment.

FIG. 3 shows a control system of the lamination equipment 3. The lamination equipment 3 has a control unit 360 for controlling this equipment 3 wholly, and the control unit 360 is connected to various units namely a memory 361 for storing various information including programs of the control unit 360, the first FAB source 303A via the first FAB source driving unit 362A, the second FAB source 303B via the second FAB source driving unit 362B, the first and second withdrawing motors 305A and 305B, the mark detection unit 306, the vacuum gauge 307, the X-axis motor 311, the X-axis position detection unit 312, the Y-axis motor 321, the Y-axis position detection unit 322, the Z-axis motor 331, the Z-axis position detection unit 332, the θ motor 341, the θ position detection unit 342, the vacuum pump 350, the first and second solenoid valves 352A and 352B, and first and second MFCs 353A and 353B.

For example, a laser interferometer or glass scale may be used as the X-axis position detection unit 312, the Y-axis position detection unit 322, and the θ position detection unit 342.

The first and second FAB source driving units 362A and 362B supply an acceleration voltage of 1 though 1.5 kV to the corresponding first and second FAB sources 303A and 303B.

The control unit 360 controls respective units in the lamination equipment 3 to perform the process in which the thin film formed on the substrate 400 with interposition of the releasing layer is bonded on the surface of the stage 302 with interposition of the sacrifial layer, a plurality of thin films separated from the substrate are bonded and laminated successively on the thin film to form a micro-structure based on programs stored in the memory 361.

Figure 4:
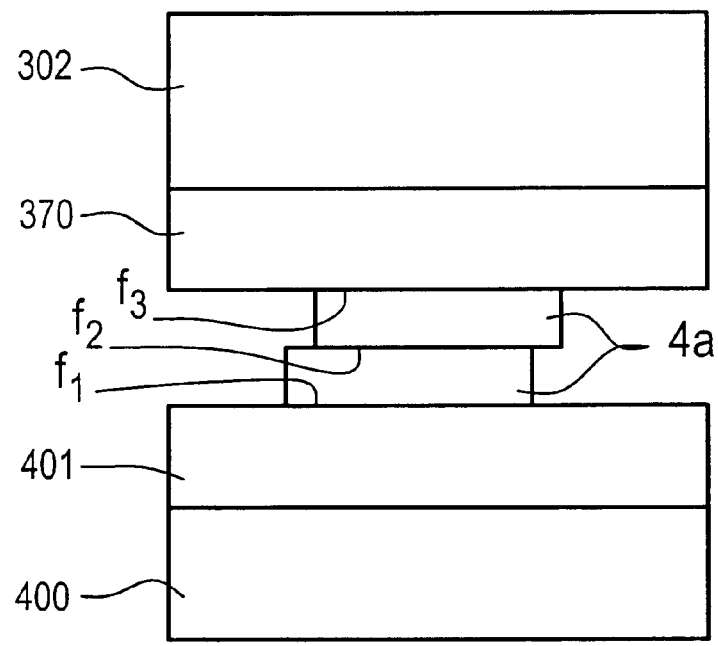
FIG. 4 is a diagram for describing the relation between the bonding strength of a sacrifice layer, a thin film, and a releasing layer in the first embodiment.

FIG. 4 shows a diagram for describing the bonding strength between the sacrifial layer, thin film, and releasing layer. Assuming that the bonding strength between the releasing layer 401 and the thin layer 4a is represented by $f_1$, the bonding strength between thin films 4a and 4a is represented by $f_2$, and the bonding strength between the thin film 4a and the sacrificial layer 370 is represented by $f_3$, then the material of the sacrificial layer 370, releasing layer 401, and thin film 4a is selected so that the order of the strength is in the relation $f_2 > f_3 > f_1$. As the result, the thin film 4a formed on the substrate 400 with interposition of the releasing layer 401 is bonded to the sacrifice layer 370 on the stage 302 or bonded to the thin film 4a transferred already on the stage 302 with sufficient strength, and can be separated from the substrate 400 and transferred to the stage 302 side.

Next, operations of the manufacturing system 1 in accordance with the first embodiment are described with reference to FIG. 5 and FIG. 6. Herein it is assumed that the sacrifial layer 370 is formed previously on the stage 302.

Figure 5:
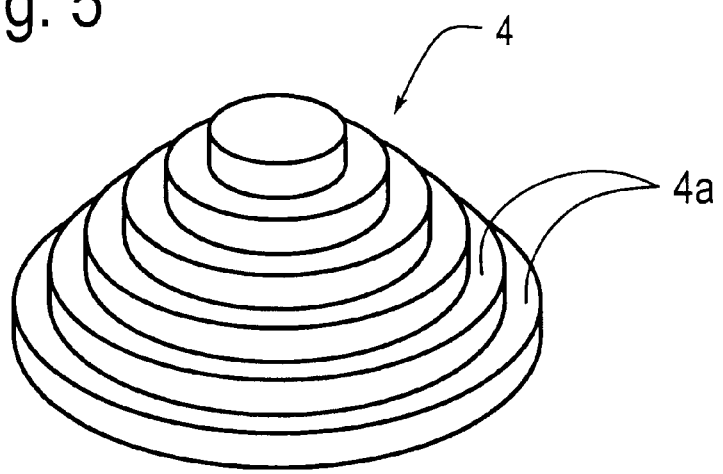
FIG. 5 is a perspective view of a target micro-structure of the first embodiment.

FIG. 5 shows one example of a micro-structure to be manufactured in the first embodiment. The micro-structure 4 comprises a plurality of thin films 4a respectively corresponding to each cross-sectional form.

Figure 6A:
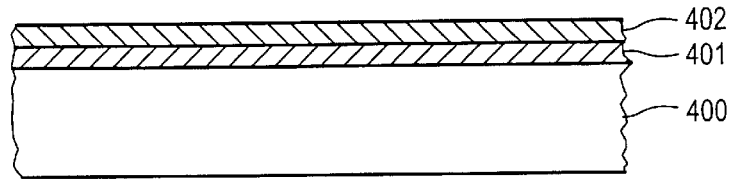
FIG. 6(a) shows a thin film deposition process in accordance with the first embodiment.
Figure 6B:
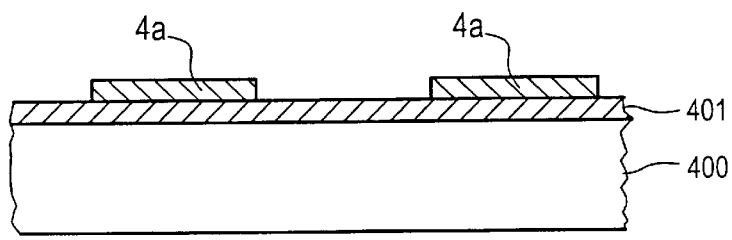
FIG. 6(b) and FIG. 6(c) show the patterning process in accordance with the first embodiment.
Figure 6C:
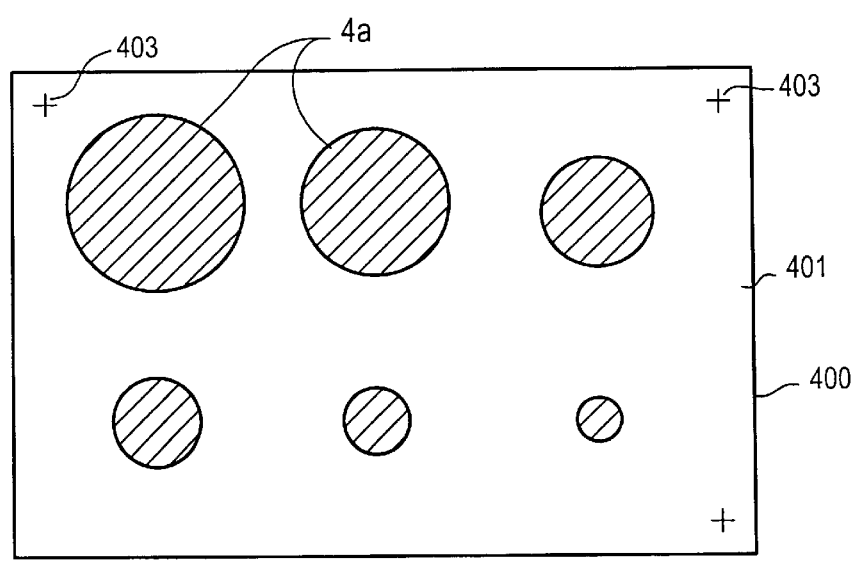

FIGS. 6(a) through (c) show a film deposition process and patterning process.

(1) Film Deposition

As shown in FIG. 6(a), by using the film deposition equipment 2A, a thermal oxide film with a thickness of 0.1 μm is grown on the surface of a substrate 400, namely an Si wafer, as the releasing layer 401, and an Al thin film 402 with a thickness of 0.5 μm is formed on the thermal oxidized film by sputtering. High purity Al is used for a sputtering target, the sputtering pressure is 0.5 Pa and the temperature of the substrate is a room temperature. The film thickness is monitored continuously by a quartz oscillator film thickness meter during film deposition, the film deposition process terminates when the film thickness reaches 0.5 μm. As the result, the film thickness on the substrate 400 with distribution within 0.5±0.02 μm is obtained. The film thickness is the determinant of the resolution in the lamination direction of the micro-structure obtained finally, and sufficient attention should therefore be paid to the film thickness and film thickness distribution.

(2) Patterning

As shown in FIGS. 6(b) and 6(c), a plurality of thin films 4a respectively corresponding to each cross-sectional form of the micro-structure 4 shown in FIG. 5 is formed by photolithography. In detail, positive type photo-resist is coated on the surface of the Al thin film 402 formed on the substrate 400, the photo-resist is exposed to light with covering by a photo-mask (omitted from the drawing), the exposed portion of the photo-resist is removed by a solvent, the exposed portion of the thin film 402 is etched, and the unexposed photo-resist is removed by a resist remover leaving the plurality of thin films 4a on the substrate. When, a plurality (for example three) of alignment marks 403 for positioning the substrate 400 in a patterning process is also formed. In FIGS. 6(b) and 6(c), the respective thin films 4a are designated as the first layer through the sixth layer in order of diameter from the largest one through smallest one for the purpose of description.

FIGS. 7(a) through 7(c) and FIGS. 8(a) through 8(c) show the lamination process described hereinafter. In FIG. 7 and FIG. 8, the releasing layer 401 and sacrificial layer 370 are omitted from the drawings.

(3) Introduction of the Substrate 400 into the Vacuum Chamber 300

The substrate 400 on which the plurality of thin films 4a are formed is placed and fired on the substrate holder 301 in the vacuum chamber 300 of the lamination equipment 3.

(4) Evacuation of the Inside of the Vacuum Chamber 300

When an operator pushes down a starting switch (not shown in the drawing) of the lamination equipment 3, the control unit 360 performs the process described hereinafter according to the program stored in the memory 361. First, the control unit 360 controls the vacuum pump 350 based on the vacuum value detected by the vacuum gauge 307 to evacuate the inside of the vacuum chamber 300 to $10^{-6}$ Pa, and the inside of the vacuum chamber 300 is brought to the condition of high vacuum or ultra-high vacuum.

(5) Alignment Adjustment

After the evacuation, the control unit 360 performs alignment adjustment of the stage 302 and the substrate 400 (alignment mark 403). In detail, the control unit 360 controls the X-axis motor 311 and the Y-axis motor 321 so as to obtain a mark detection signal from the mark detection unit 306 by moving the stage 302 in the X-direction and Y-direction, measures the relative positional relation between the substrate 400 and substrate holder 301 based on the mark detection signal, and controls the X-axis motor 311, the Y-axis motor 321, and the θ motor 341 so that the stage 302 and alignment mark 403 reach the original position based on the measurement result of the relative position relation. The stage 302 is moved in the X-direction and the Y-direction respectively by the X-axis motor 311 and the Y-axis motor 321, the substrate holder 301 is rotated by the θ motor 341, and the stage 302 and alignment mark 403 reach the original position. Hence, even though the position where the substrate 400 on which the thin films 4a are formed is placed deviates from the correct position, the relative position between the stage 302 and the alignment mark 403 is set correctly.

Figure 7A:
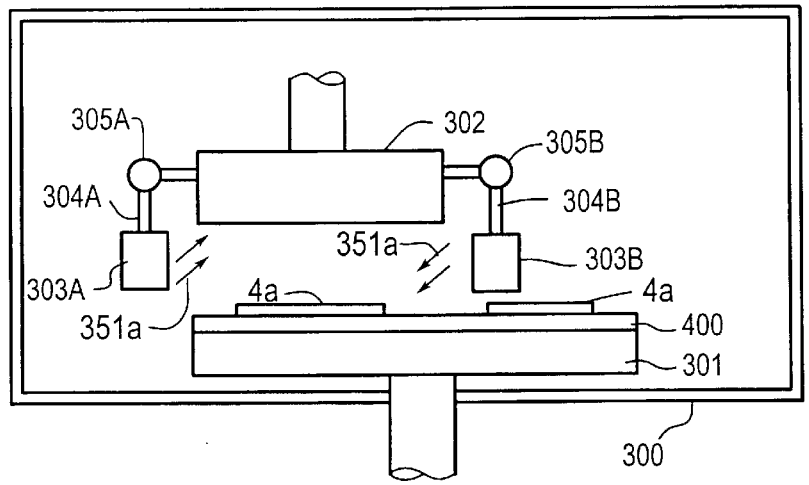
FIG. 7 is a set of diagrams, FIGS. (a) through (c) show the lamination process in accordance with the first embodiment.

(6) Removal of the Contaminated Layer on the Surface to be Bonded to the First Layer Thin Film 4a As shown in FIG. 7(a), the control unit 360 drives the X-axis motor 311 and the Y-axis motor 321 based on the detection signal of the X-axis position detection unit 312 and the Y-axis position detection unit 322, and moves the stage 302 from the original position in the X-direction and Y-direction to position the stage 302 on the first layer thin film 4a. Then the control unit 360 irradiates an argon atomic beam 351a onto the surface (the surface of the stage 302 and the surface of the first layer thin film 4a) where the first layer thin film 4a is to be bonded for FAB treatment. In detail, the control unit 360 performs driving control on the first and second FAB source driving units 362A and 362B, operation control on the first and second solenoid valves 352A and 352B, and flow rate control on the first and second MFCs 353A and 353B so that the argon atomic beam 351a is applied onto the surface of the stage 302 and the surface of the first layer thin film 4a with a prescribed rate for a prescribed time (for example, 5 minutes). The first and second FAB source driving units 362A and 362B are controlled by the control unit 360 so as to provide an acceleration voltage of, for example, 1.5 kV to the first and second FAB sources 303A and 303B. The flow rate of argon gas supplied from the argon gas cylinder 351 is controlled by the first and second MFCs 353A and 353B, and argon gas is supplied to the first and second FAB sources 303A and 303B through the first and second solenoid valves 352A and 352B. The first FAB source 303A irradiates the argon atomic beam 351a for 5 minutes onto the surface of the stage 302 which is located off the upper direction at an angle of about 45°. The second FAB source 303B irradiates the argon atomic beam 351a for 5 minutes onto the surface of the first layer thin film 4a which is located off the lower direction at an angle of about 45°. The contaminated layers with a thickness of less than 10 nm on the surface of the stage 302 and the first thin film 4a are removed thereby. Such small thickness decrement can be neglected because the number of decrement is one figure smaller than the target film thickness precision of 0.1 μm of the present invention.

(7) Bonding of the First Layer Thin Film 4a

Figure 7B:
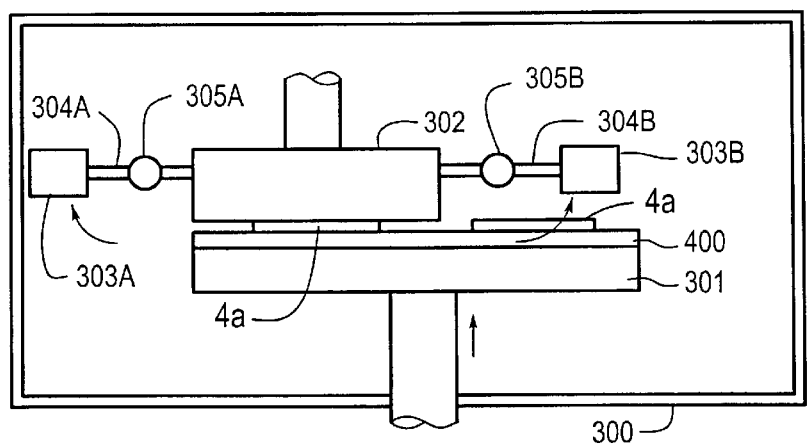

Next, as shown in FIG. 7(b), the control unit 360 drives the first and second withdrawing motors 305A and 305B to rotate the arms 304A and 304B in the horizontal direction, and withdraws the first and second FAB sources 303A and 303B. The control unit 360 controls the Z-axis motor 331 based on the detection signal of the Z-axis position detection unit 332 to elevate the substrate holder 301, the surface of the first layer thin film 4a is forced to be in contact with the surface of the stage 302, and the contact continues for a prescribed time (for example, 5 minutes) with a prescribed pressure (for example, 50 kgf/cm²). The surface of the first layer thin film 4a is bonded to the surface of the stage 302 (sacrificial layer 370) strongly. A tensile test for evaluation of the bonding strength between the thin film 402 and the sacrificial layer 370 shows 50 through 100 Mpa. Preferable surface roughness of the thin film 4a and stage 302 is respectively about 10 nm for obtaining excellent bonding strength.

(8) Transfer of First Layer Thin Film 4a

Figure 7C:
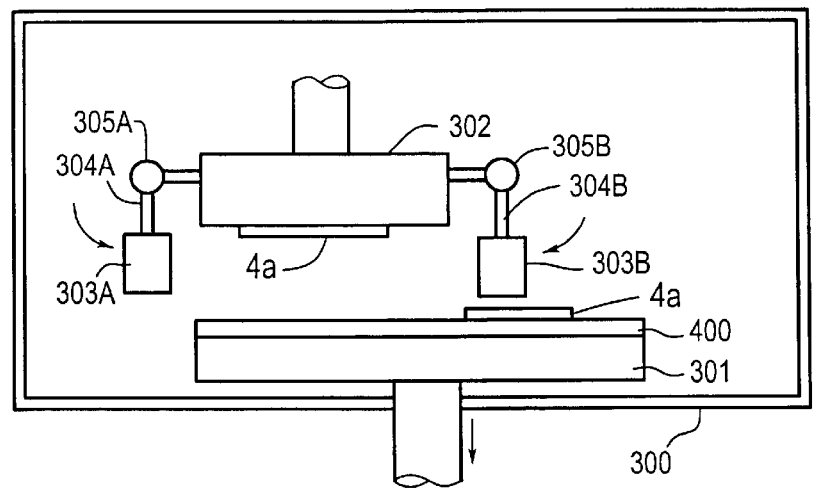

Next, as shown in FIG. 7(c), the control unit 360 drives the Z-axis motor 331 based on the detection signal of the Z-axis position detection unit 332 to lower the substrate holder 301 to the original position shown in FIG. 7(a), and drives the first and second withdrawing motors 305A and 305B to return the first and second FAB sources 303A and 303B to the original position. By lowering the substrate holder 301, the thin film 4a is separated from the substrate 400 and transferred to the stage 302 side because the bonding strength $f_3$ between the thin film 4a and the sacrifical layer on the stage 302 is larger than the bonding strength $f_1$ between the thin film 4a and the releasing layer.

Figure 8A:
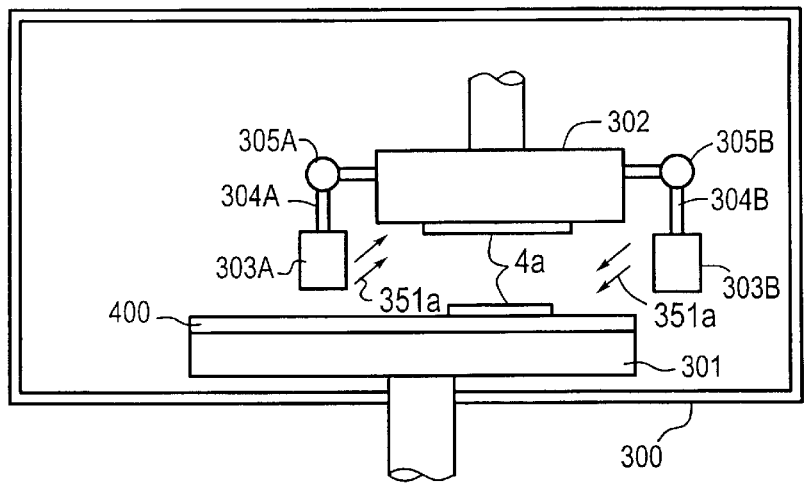
FIG. 8 is a set of diagrams, FIGS. (a) through (c) show the lamination process in accordance with the first embodiment.

(9) Removal of a Contaminated Layer on the Surface to be Bonded to the Second Layer Thin Film 4a Next, as shown in FIG. 8(a), the control unit 360 controls the X-axis motor 311 and the Y-axis motor 321 to move the stage 302 above the second layer thin film 4a, and irradiates again FAB as described in FIG. 7(a). The moving distance of the stage 302 is a distance corresponding to each thin film 4a pitch. This FAB irradiation is different from the first FAB irradiation in that the back surface of the first layer thin film 4a (the surface which has been in contact with the substrate 400) is irradiated for cleaning instead of the surface of the stage 302.

(10) Bonding of the Second Layer Thin Film 4a

Figure 8B:
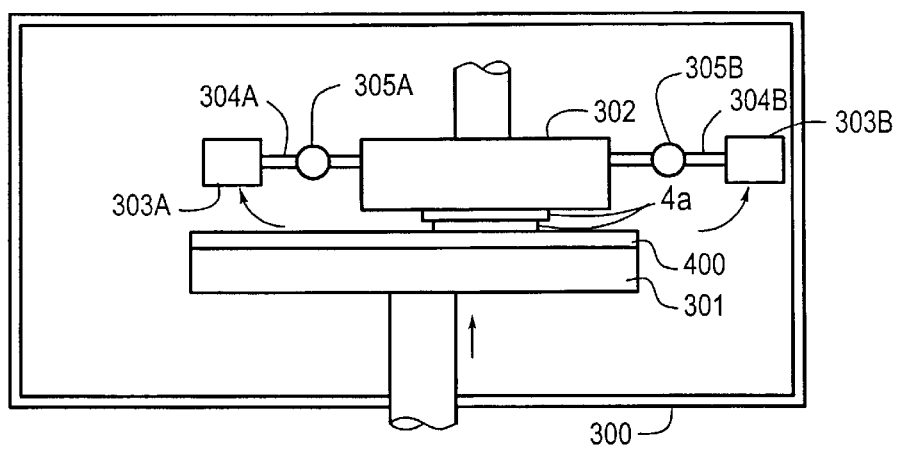

Next, as shown in FIG. 8(b), the control unit 360 withdraws the first and second FAB sources 303A and 303B, elevates the substrate holder 301 to bond the second layer thin film 4a to the first layer thin film 4a.

(11) Transfer of the Second Layer Thin Film 4a

Figure 8C:
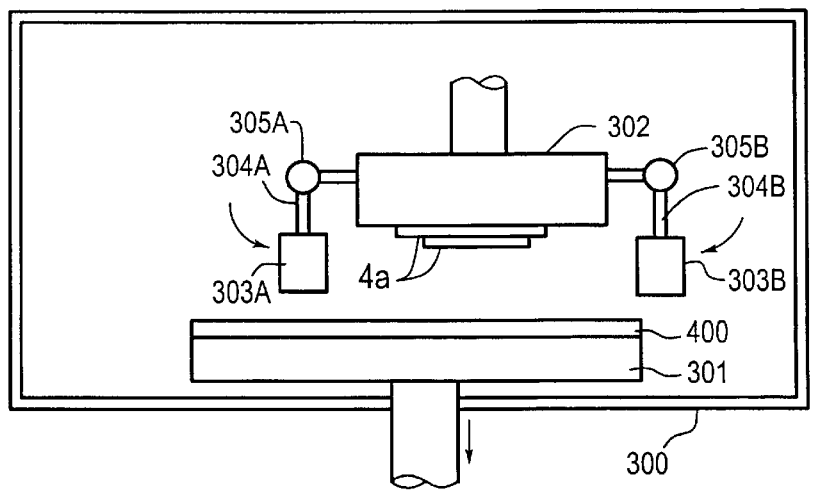

Next, as shown in FIG. 8(c), the control unit 360 lowers the substrate holder 301, returns the first and second FAB sources 303A and 303B to the original position, and lowers the substrate holder 301. By lowering the substrate holder 301, the second layer thin film 4a is separated from the substrate 400 side and transferred onto the first thin film 4a because the bonding strength $f_2$ between thin films is larger than the bonding strength $f_1$ between the thin film 4a and the releasing layer 401.

(12) Removal of the Sacrifical Layer 370

Figure 9:
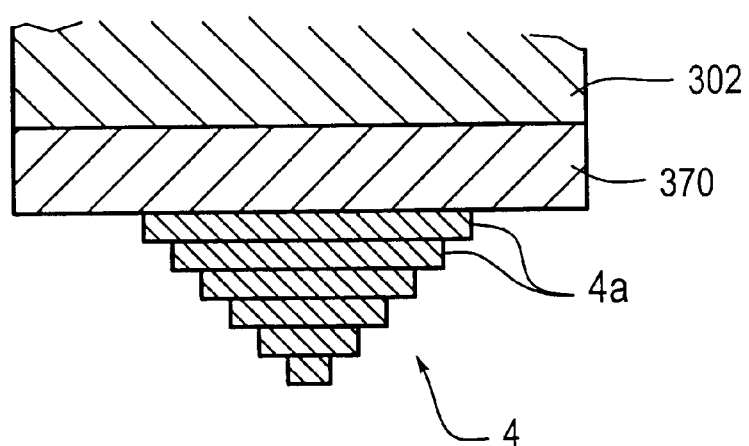
FIG. 9 is a cross-sectional view for showing completion of a lamination process in accordance with the first embodiment.

FIG. 9 shows the state that all the thin films 4a have been laminated. By repeating bonding and transferring of the thin films 4a of third layer through sixth layer successively, a micro-structure 4 comprising all the laminated thin films 4a is obtained. Finally the sacrificial layer 370 is removed by etching and the micro-structure 4 is separated from the stage 302.

The effect of the above-mentioned first embodiment is described hereinafter, (a) A plurality of thin films 4a which are components of a micro-structure are formed simultaneously together by film deposition and patterning, the plurality of thin films 4a are laminated therefore simply by repeating bonding and transfer processes, thus the productivity is enhanced significantly. Micro-structures are manufactured efficiently because once the vacuum chamber 300 is evacuated, a set of irradiation of FAB, bonding, and transfer processes can be performed continuously without breaking the vacuum.

(b) A plurality of thin films corresponding to each cross-sectional form of a micro-structure is formed together by one process of film deposition and patterning, it is therefore possible to save the time required for the whole process significantly.

(c) By injection molding of plastics using the obtained micro-structure 4 as a mold, micro-optical parts such as optical lenses are mass-produced.

(d) Because the thin film 4a is bonded to the stage 302 side by surface activated bonding, it is not necessary to use an adhesive or to dissolve the material, and therefore the form and thickness of the thin film 4a will not change when bonding, thus high precision is maintained.

In this embodiment, thin films are bonded by surface activated bonding, however, the thin films may be bonded by bonding with an adhesive, or diffusion bonding with heating.

In this embodiment, the thin films are patterned after film deposition, however, alternatively, a simultaneous film deposition and patterning, for example, a method using a metal mask, or selective CVD may be used.

In this embodiment the Al thin film is formed by sputtering, however alternatively, the Al thin film may be formed by resistance heating vapor deposition or electron beam heating vapor deposition.

Further, the material used for the thin film is not limited to Al, but alternatively other metals such as tantalum (Ta), copper, or indium may be used, and ceramics such as alumina, aluminum nitride, silicon carbide, or silicon nitride may also be used.

In this embodiment the ease that the substrate holder 301 is moved in the Z-direction, and the stage 302 is moved in the X-direction and the Y-direction is described, however, a case that both the substrate holder 301 and the stage 302 are moved in the Z-direction, a case that the substrate holder 301 is moved in the X-direction and the Y-direction, and the stage 302 is moved in the Z-direction, or a case that the substrate holder 301 and the stage 302 have the same structure may be used.

A set of processes of film deposition, patterning, bonding, and transferring may be repeated on every thin film 4a.

Next, a manufacturing system in accordance with the present invention will be described hereinafter. The manufacturing system is provided with a film deposition equipment, a patterning equipment, and a lamination equipment like the first embodiment, but different in that the film deposition equipment and patterning device are structured so as to form a plurality of first thin films corresponding to each cross sectional form of a micro-structure by a lift off method, and different in that a polishing device not shown in the drawing for polishing the surface of a substrate by CMP (Chemical Mechanical Polishing) is provided in order to form the second thin film made of the different material from that of the first thin film and having the same thickness as that of the first thin film around the first thin film.

Next, operations of the manufacturing system in accordance with the second embodiment are described with reference to FIG. 10 and FIG. 11 hereinafter.

Figure 10A:
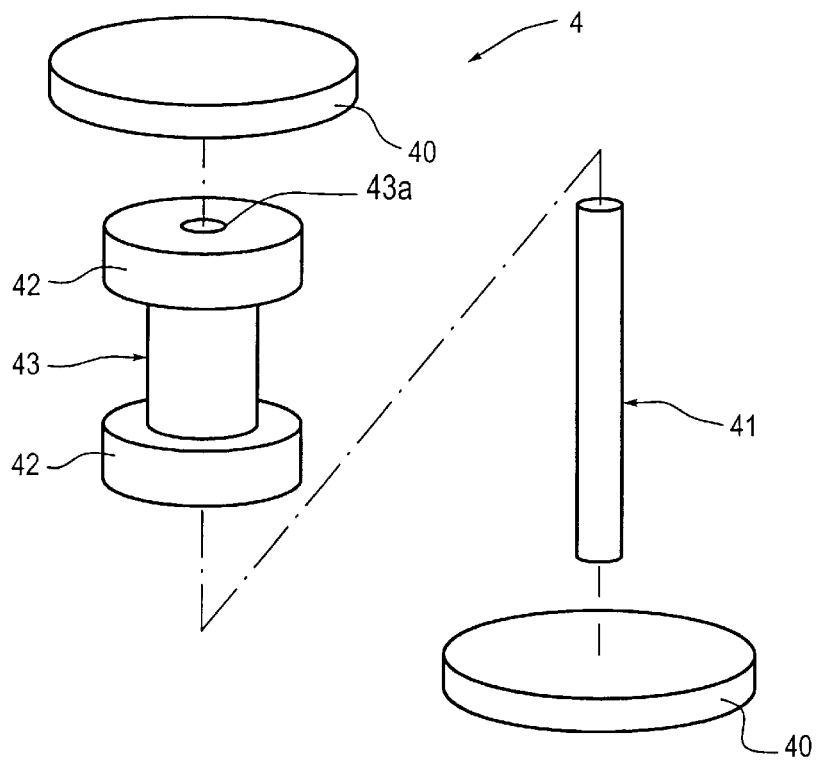
FIG. 10(a) is an exploded perspective view of a micro-pulley, namely a micro-structure.
Figure 10B:
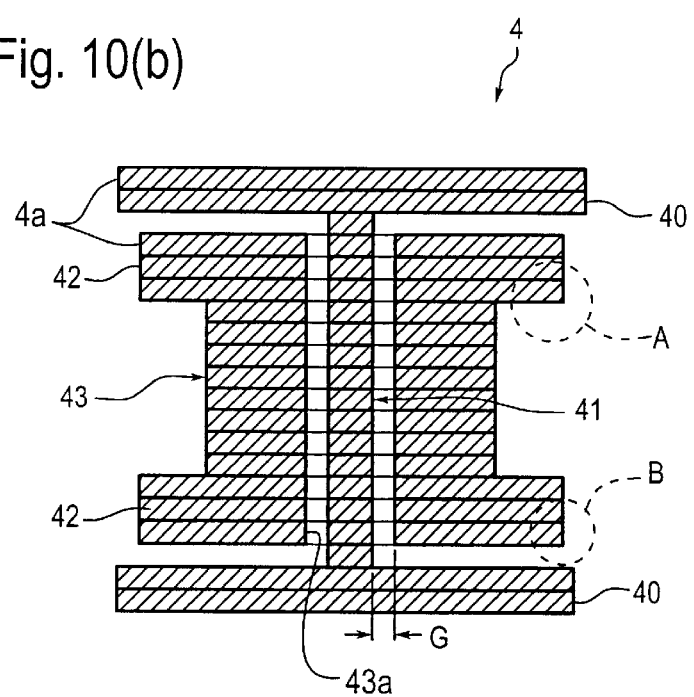
FIG. 10(b) is a cross-sectional view of the micro-pulley.

FIG. 10 shows a micro-pulley namely micro-structure 4 to be manufactured in the second embodiment, FIG. 10(a) is an exploded perspective view and FIG. 10(b) is a longitudinal cross-sectional view. The micro-structure 4 shown in the drawing is composed of the first layer through twentieth alumina thin films 4a, and has a structure that a shaft 41 provided with flanges 40 and 40 on both ends thereof is inserted into an opening 43a of the pulley 43 provided with collars 42 and 42.

FIG. 11 shows film deposition and patterning processes.

As shown in FIG. 11(a), by using the film deposition equipment, a thermal oxide film with a thickness of 0.1 μm is grown on the surface of the substrate 400, namely an Si wafer, as the releasing layer 401. Then, photo-resist 404 is coated on the releasing layer 401 over the entire surface, portion of the photo-resist corresponding to each cross-sectional form of the micro-structure 4 is separated by patterning of exposure and development, and the first thin film 402A with a thickness of 1 μm made of alumina ($Al_2O_3$) is deposited over the entire surface using the film deposition equipment.

Next, as shown in FIG. 11(b), the residual photo-resist 404 is removed together with the first thin film 402A formed thereon (lift off method). The residual first thin film 402A is the thin film 4a to be the component of the micro-structure 4.

Then, as shown in FIG. 11(c), the second thin film 402B consisting of aluminum (Al) with a thickness of 1.1 μm is formed by sputtering using the film deposition equipment. At this stage, the first thin film 402A is covered over the entire surface with the second thin film 402B. In this embodiment, the combination of the first thin film 402A of $Al_2O_3$ and the second thin film 402B of Al is selected because these materials are bonded easily to each other by surface activated bonding and selectively removable.

Next, as shown in FIG. 11(d), the surface of the second film 402B is polished to remove the second thin film 402B by the CMP method using the polishing equipment until the first thin film 402A (4a) is exposed. The thickness of both the $Al_2O_3$ thin film and Al thin film 402B becomes 1 μm. The surface roughness of the $Al_2O_3$ thin film 4a is about 10 nm like the stage 302. The roughness helps obtain a high bonding strength $f_2$ between the thin films 4a and 402B.

Figure 12:
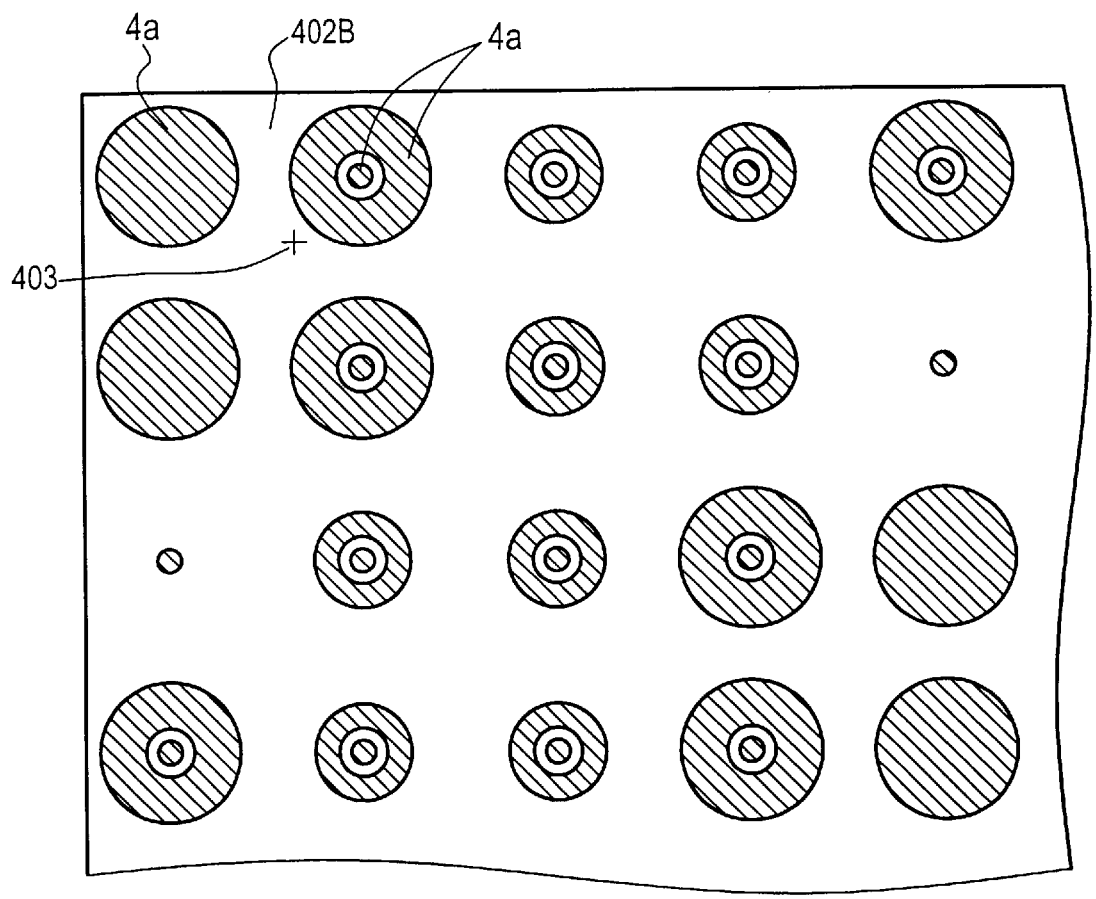
FIG. 12 is a plan view of a substrate for showing the patterning process in accordance with the second embodiment.

FIG. 12 is a plan view corresponding to FIG. 11(d) During pattern forming shown in FIG. 12, a plurality (for example, three) of alignment marks 403 are formed.

Further, as shown in FIG. 11(e), the second thin film 402B between each pattern is removed by normal photolithography or scribing using the patterning device to form a partition groove 405, and each cross-sectional element 4b is separated.

Figure 13:
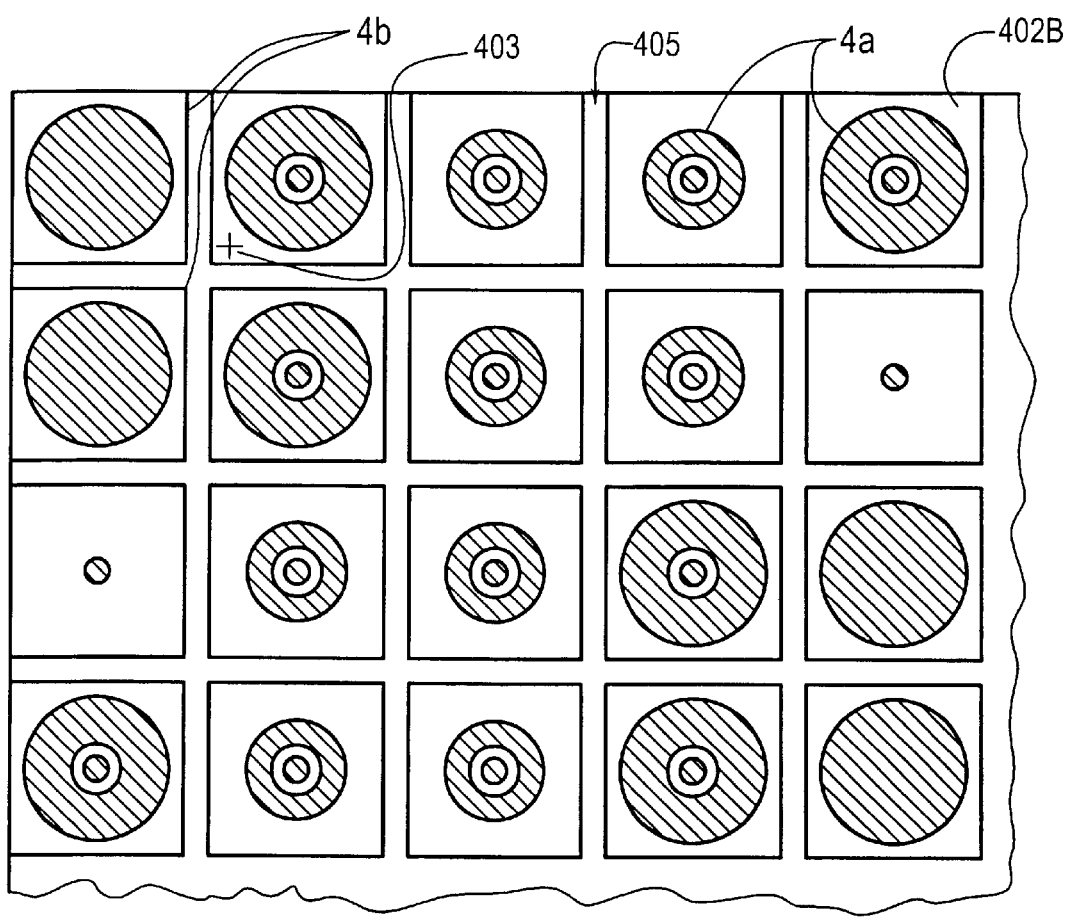
FIG. 13 is a plan view of a substrate for showing the patterning process in accordance with the second embodiment.

FIG. 13 is a plan view corresponding to FIG. 11(e). The thin film 4a and the second thin film 402B both having the same thickness which are to be components of the micro-structure 4 are now arranged. In this embodiment, every cross-sectional element 4b which is to structure one micro-structure 4 is arranged regularly in rows and columns.

Next, as in the first embodiment, the substrate 400 on which a plurality of thin films 4a are formed is introduced into the vacuum chamber of the lamination equipment, and then evacuation of the vacuum chamber, alignment adjustment, removal of contaminated layers, thin film bonding, and transfer are performed.

Figure 14:
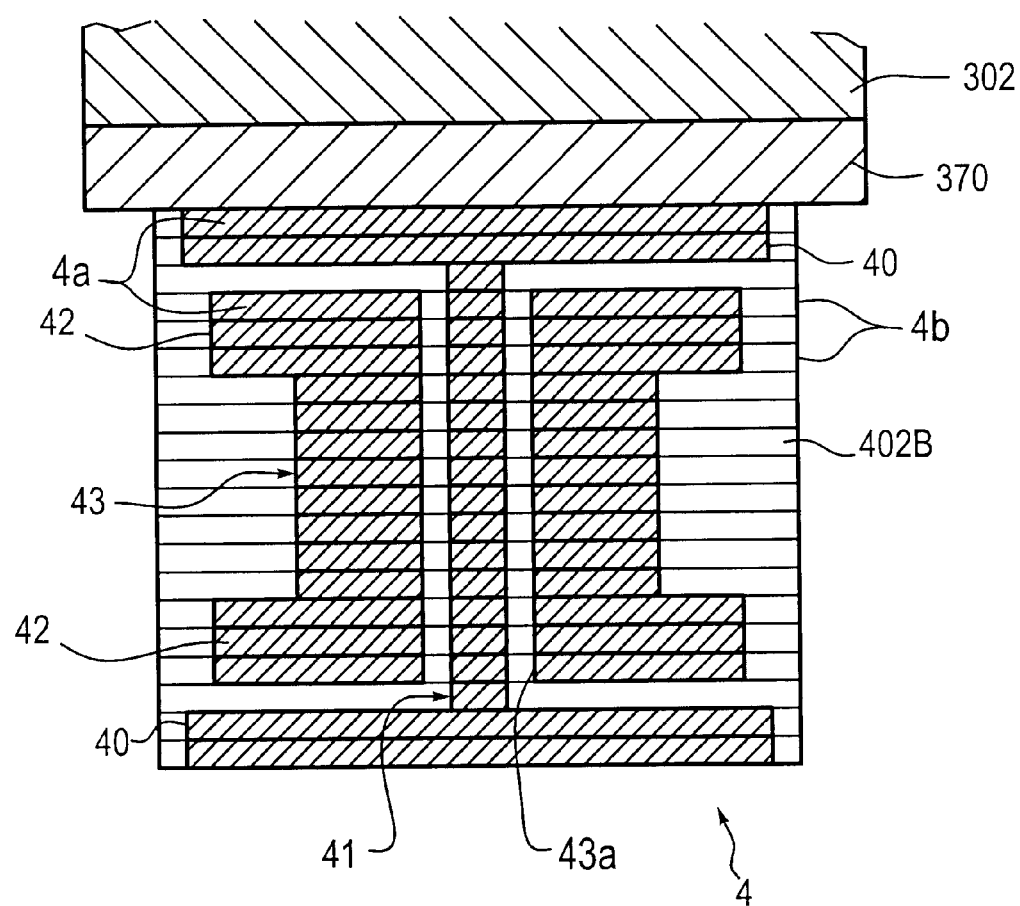
FIG. 14 is a cross-sectional view for showing laminated cross-sectional elements of the first layer through twentieth layer in accordance with the second embodiment.

FIG. 14 shows a laminated layer comprising the first layer cross-sectional element 4b through the twentieth layer cross-sectional element 4b. In this drawing, the shaded portion shows the thin film 4a consisting of $Al_2O_3$ and the non-shaded portion shows the second thin film 402B consisting of Al. By repeating the above-mentioned processes, the cross-sectional elements 4b of the first layer through twentieth layer are laminated on the stage 302 with interposition of the sacrifical layer 370. When the lamination is completed, the appearance is seemed to be a rectangular parallelepiped of Al, and the pulley 43, the shaft 41 and two fringes 40 consisting of $Al_2O_2$ are imbedded internally. Finally, the Al rectangular parallelepiped is soaked in an etching solution for dissolving Al to remove only the second thin film 402B consisting of Al, and the sacrifical layer 370 is removed, hence the micro-pulley 43 combined with the shaft 41 consisting of $Al_2O_3$ is completed.

According to the second embodiment, effects described hereinafter are obtained.

(a) As shown in FIG. 10, a micro-structure comprising a plurality of complex combined parts can be manufactured. Because the first thin film 4a of $Al_2O_3$ and the second thin film 402B of Al having the same thickness are laminated simultaneously, the micro-structure can be laminated correctly even though the micro-structure 4 has an overhang portion (A in FIG. 10(b)) or separate portion (B in FIG. 10(b)), further the small gap (G in FIG. 10(b)) between the shaft 41 and pulley 43 is maintained correctly.

(b) A micro-structure in the form of a micro-gear can be manufactured.

Figure 15A:
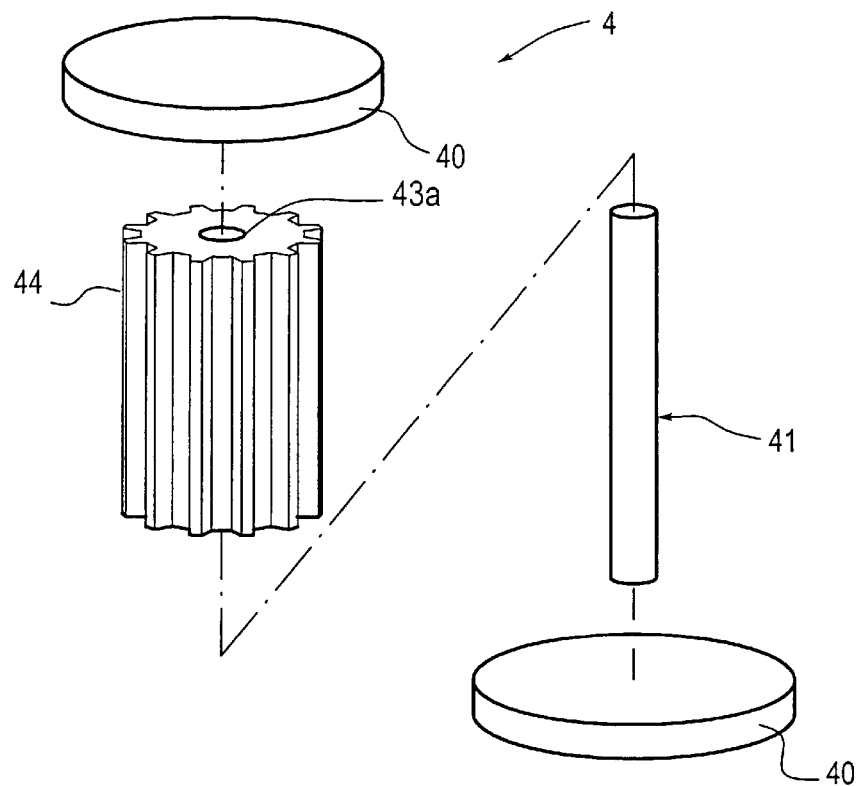
FIG. 15(a) is an exploded perspective view of a target micro-gear of the second embodiment.
Figure 15B:
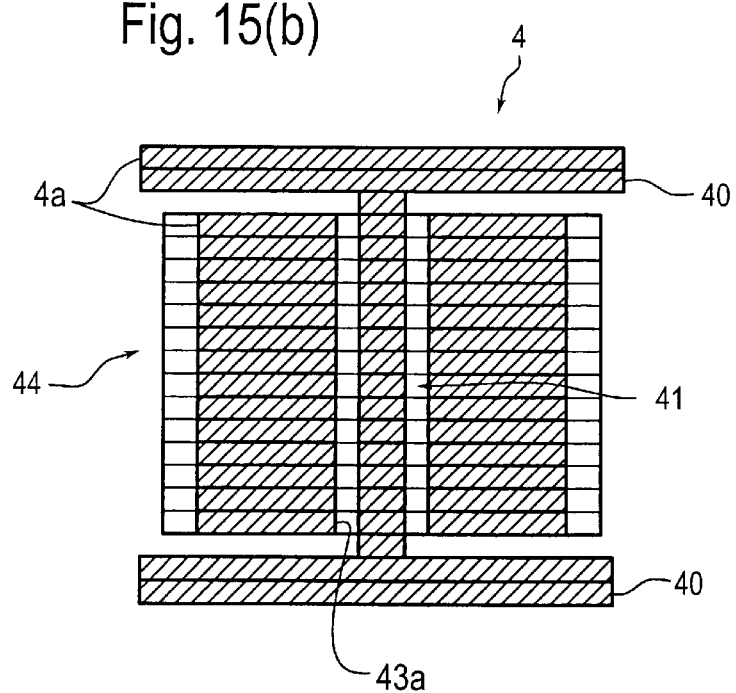
FIG. 15(b) is a longitudinal cross-sectional view of the micro-gear.

FIG. 15 shows a micro-gear, FIG. 15(a) is an exploded perspective view, and FIG. 15(b) is a longitudinal cross-sectional view. The micro-structure 4 shown in FIG. 15 is composed of thin films 4a of the first layer through twentieth layer and the micro-structure has a structure that a shaft 41 provided with flanges 40 and 40 on both sides is inserted into an opening 43a of the micro-gear 44.

(c) Not only can a micro-structure consisting of a metal or an insulator be formed directly but also a micro-structure having a complex structure comprising a plurality of combined components can be manufactured, and assembling work for manufacturing micro-structures is significantly reduced.

In this embodiment, the case that combination of ceramics and metal namely $Al_2O_3$ for the first thin film and Al for the second thin film is described, however, alternatively, combinations, for example, a combination of a metal and a ceramic such as Al and $Al_2O_3$, a combination of a metal and another metal such as Ta and Al, to or, Al and Cu, and a combination of two kinds of ceramics such as alumina and silicon nitride, may be used. This combination is determined by considering the bondability to each other and capability of selective etching.

The CMP method is used in this embodiment, however, a method in which a thin film is deposited under precise thickness control and the exclusive pattern having the same film thickness is formed by patterning through two photo-lithography may be used.

The second thin film is removed by etching after all the cross-sectional elements 4b are laminated in this embodiment, however, a method in which the first thin film is formed of a material which is easy to remove and then the first thin film is removed may be used. A mold composed of the second thin film having an inside configuration complementary to the target micro-structure is obtained thereby, and then micro-structures consisting of plastics can be mass-produced by injection molding, cast molding, or press molding using this mold.

Figure 16:
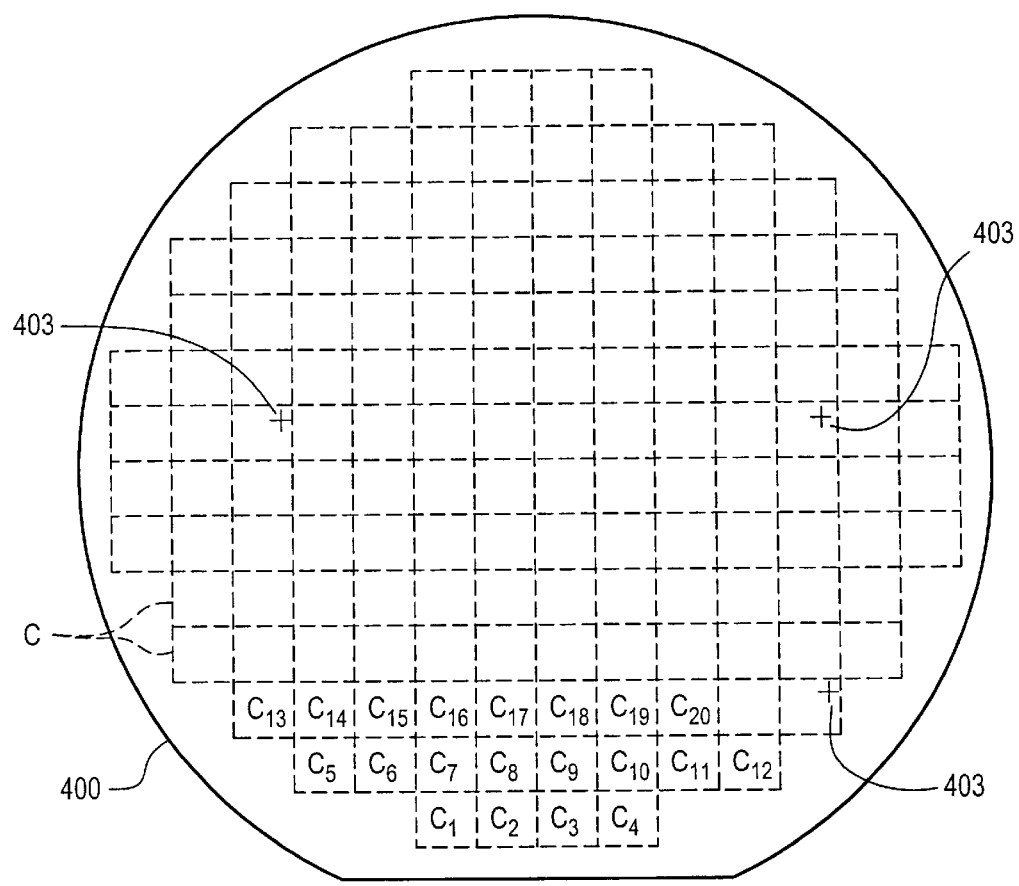
FIG. 16 is a plan view for showing a thin film deposition substrate in accordance with the third embodiment of the present invention.
Figure 17A:
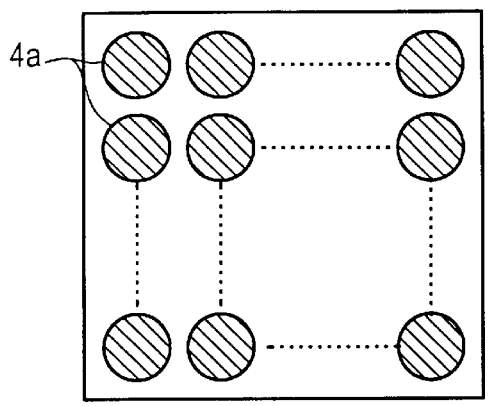
FIGS. 17(a) through (d) are plan views for showing a thin film deposition substrate in accordance with the third embodiment of the present invention.
Figure 17B:
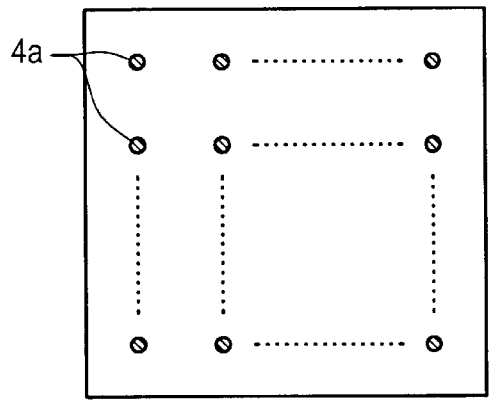
Figure 17C:
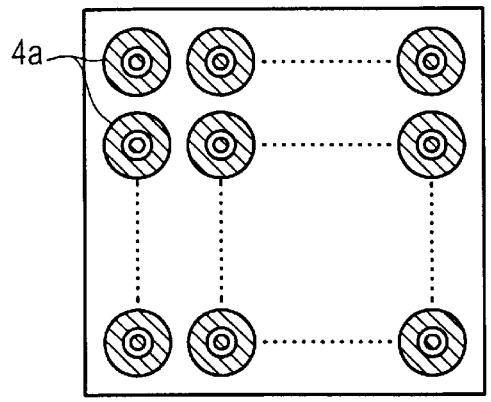
Figure 17D:
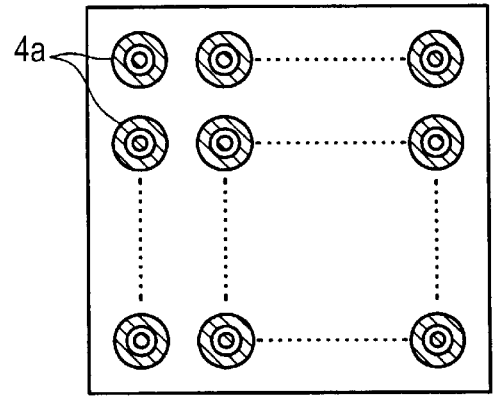

FIG. 16 and FIG. 17 show a thin film deposition substrate in accordance with the third embodiment. The thin films 4a of the first layer through twentieth layer are formed continuously and separately on the substrate 400 in the second embodiment, but in the third embodiment 148 chips having a size of 10 mm square are formed on one silicon wafer having a size of 6 inches, and about 7,000 thin films 4a having the same thickness are arranged two-dimensionally with a 120 μm pitch on each chip C. In FIG. 16, a pattern shown in FIG. 17(a) is formed on respective chips $C_1$, $C_2$, $C_{19}$, and $C_{20}$, a pattern shown in FIG. 17(b) is formed on respective chips $C_3$ and $C_{18}$, a pattern shown in FIG. 17(c) is formed on respective chips $C_4$, $C_5$, $C_6$, $C_{15}$, $C_{16}$, and $C_{17}$, and a pattern shown in FIG. 17(d) is formed on respective chips $C_7$ through $C_{14}$.

Figure 18:
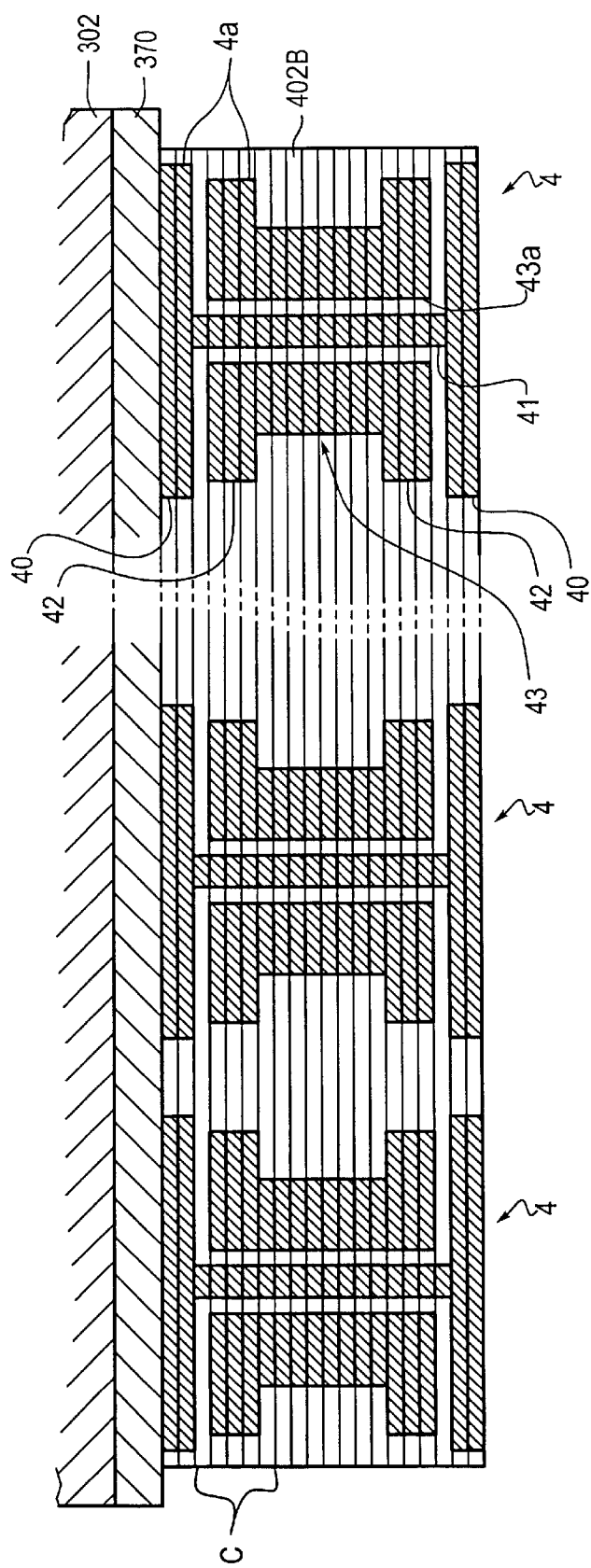
FIG. 18 is a cross-sectional view for showing laminated chips of the first layer through twentieth layer in accordance with the third embodiment.

FIG. 18 shows a laminated layer of chips C composed of the first layer to twentieth layer. The second thin film 402B in the chip C is removed and the sacrifical layer 370 is removed by etching, thereby 7,000 micro-structures 4 shown in FIG. 10 are obtained simultaneously, 49,000 micro-structures 4 are obtained from one wafer, as the result, micro-structures can be mass-produced. In this embodiment, an embodiment that one type of micro-structures is arranged in a chip, but a plurality of different types of micro-structures having different flange diameters and pulley diameters may be arranged.

Figure 19:
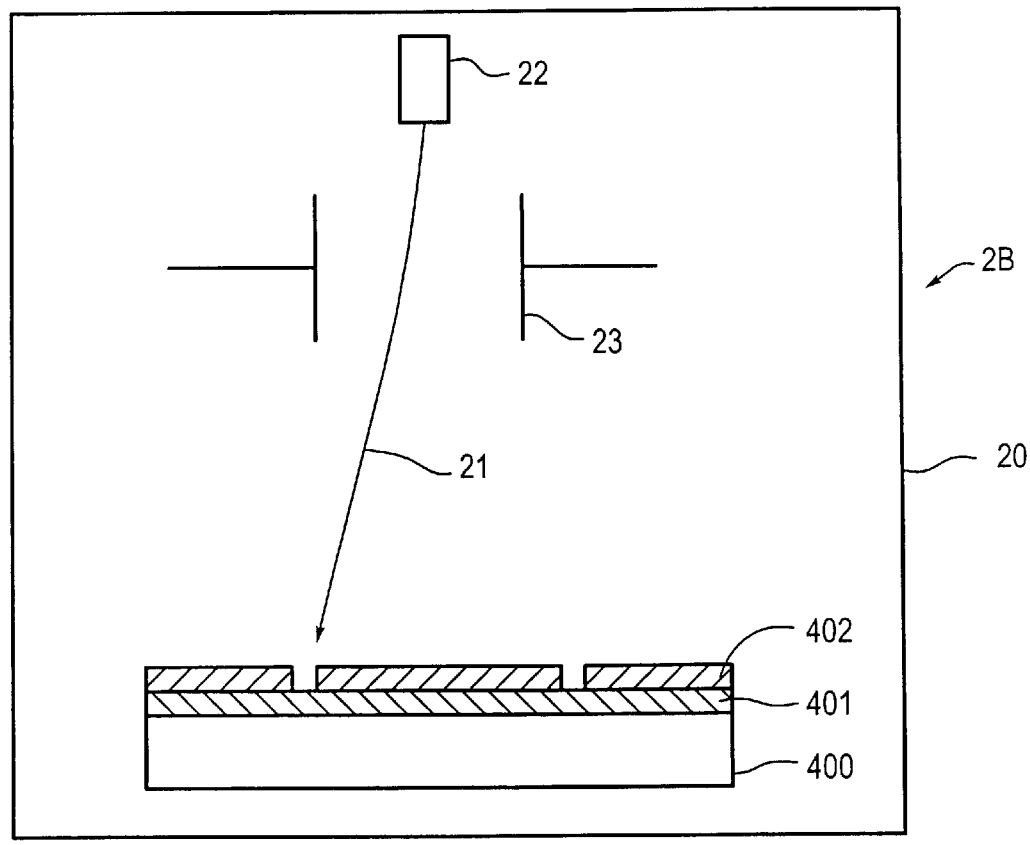
FIG. 19 is a schematic structural diagram of the patterning equipment in accordance with the fourth embodiment of the present invention.

FIG. 19 shows a patterning equipment 2B in accordance with the fourth embodiment of the present invention. The fourth embodiment has the same structure as the first embodiment excepting the patterning equipment 2B. The patterning equipment 2B has a vacuum chamber 20, and in the vacuum chamber 20 an ion beam generator 22 and a deflection electrode 23 for deflecting an ion beam 21 emitted from the ion beam generator 22 based on slice data of the micro-structure are provided, a thin film 402 is formed on a substrate 400 with interposition of a releasing layer 401 as shown in FIG. 19, then the substrate 400 on which the thin film 402 is formed is introduced into the vacuum chamber 20, and unnecessary portions or circumference of the thin film 402 is removed by a focused ion beam (FIB) method. In this embodiment, the circumference is removed. "FIB method" generally means a method that vapor of gallium (Ga) is accelerated by an electric field and focused to a thin beam, and the beam is scanned by applying a voltage to a deflection electrode and applied onto desired portions on the target, such a method is generally used for analysis or observation of a sample or used for fine working as in this embodiment.

Next, operations in this embodiment is described with reference to FIG. 20.

Figure 20:
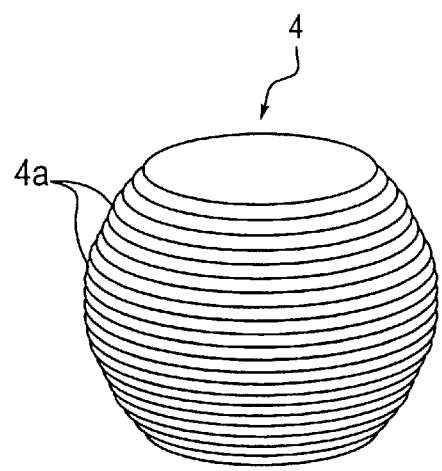
FIG. 20 is a perspective view of a target micro-structure of the fourth embodiment.

FIG. 20 shows a micro-structure 4 to be manufactured in the fourth embodiment. The micro-structure 4 has a drum configuration composed of thin films first layer to n-th layer. As in the first embodiment, a releasing layer 401 is formed on a substrate 400, and an Al thin film 402 having a thickness of 0.5 µm is deposited. Next, as shown in FIG. 19, the substrate 400 is introduced into the vacuum chamber 20, and the Al thin film 402 is selectively removed by the FIB method. Though not only the Al layer is removed but also the substrate surface is slightly removed because the etching in the depth direction is controlled not so precisely in the removal process by the FIB method, the slight removal of the substrate 400 causes no problem because of no micro-parts in the lower layer.

Figure 21:
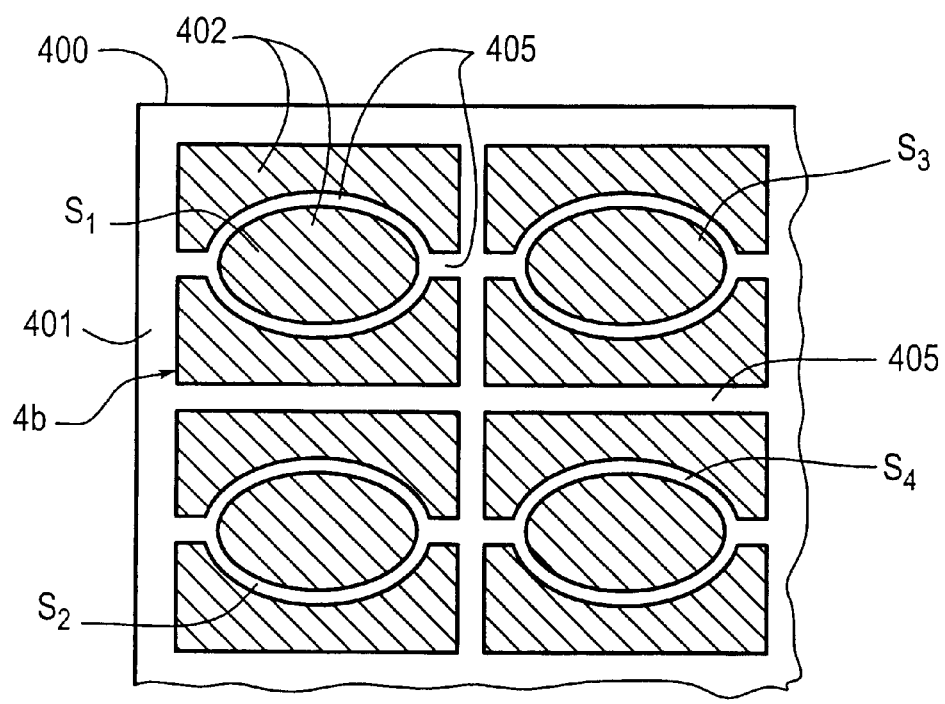
FIG. 21 is a plan view of a substrate for showing the patterning process in accordance with the fourth embodiment.

FIG. 21 is a plan view for showing the structure after patterning. In the drawing, 405 is a partition groove formed by the FIB method. The form of patterning is that regions $S_1$, $S_2$, $S_3$, $S_4$, . . . having respective forms corresponding to each cross-sectional form of the micro-structure 4 are arranged with a space between them in the respective cross-sectional elements 4b. A cross-sectional element 4b has an arbitrary form with a size larger than the maximum cross-sectional area of the micro-structure 4 to be manufactured, and is rectangular in this embodiment. Cross-sectional elements 4b each of which has a cross-sectional pattern of the micro-structure to be manufactured are arranged two-dimensionally on the entire surface of the substrate 400.

Following the process described herein above, the substrate on which a plurality of cross-sectional elements 4b are formed is introduced into the vacuum chamber 300 of the lamination equipment 3, and by repeating processes of bonding and transfer the micro-structure 4 composed of the plurality of laminated cross-sectional elements 4b is completed.

Figure 22:
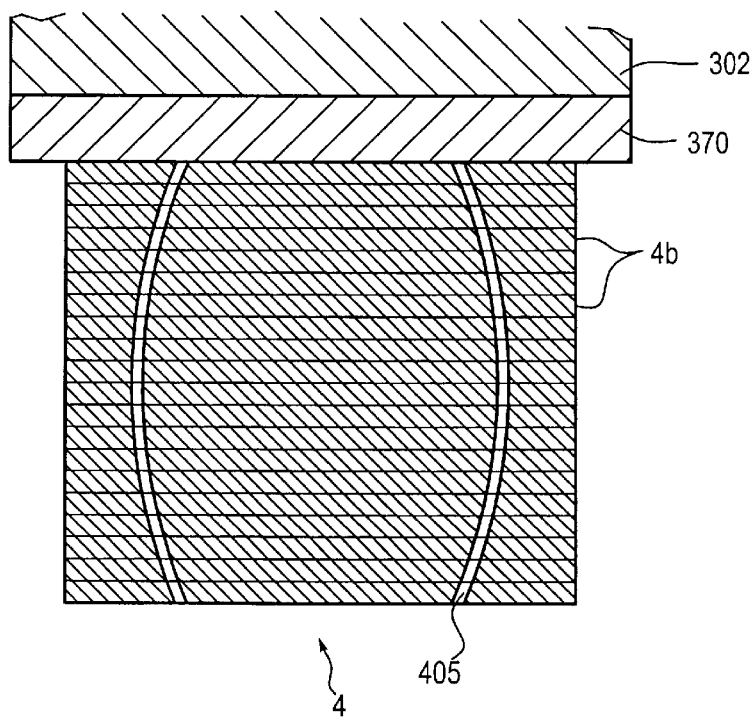
FIG. 22 is a cross-sectional view for showing laminated cross-sectional elements of the first layer through n-th layer in accordance with the fourth embodiment.

FIG. 22 shows laminated cross-sectional elements 4b of the first layer though the n-th layer. The micro-structure 4 composed of central regions $S_1$, $S_2$, $S_3$, $S_4$, . . . of the respective cross-sectional elements 4b is obtained by etching-removing the sacrifical layer 370.

According to the above-mentioned fourth embodiment, because FIB thin film patterning allows the process to be performed without a photo-mask for patterning the thin films, the time required for manufacturing is shortened. The pressure can be kept constant when laminating thin films because the areas of all the cross-sectional elements 4b are substantially the same. Only the grid region for separating each cross-sectional element 4b and the border region in each cross-sectional element 4b are removed, and therefore the time required for processing is saved. The drawing precision of about 0.1 µm is obtained, precise forming of a micro-structure is realized.

FIB is used in the above-mentioned embodiment, however, alternatively, an electron beam may be used.

Figure 23:
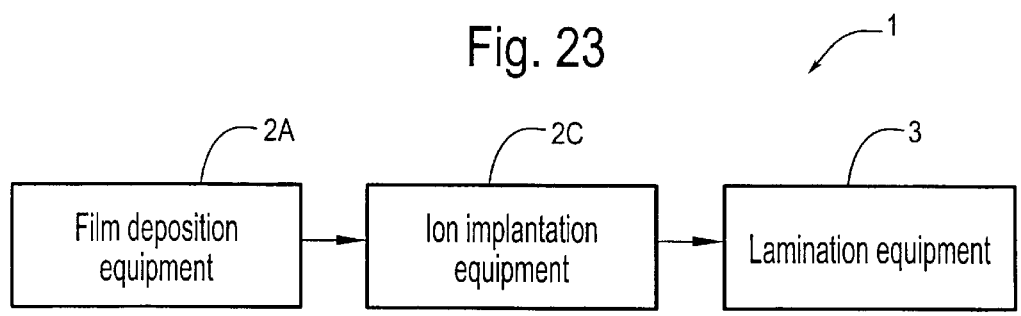
FIG. 23 is a block diagram for illustrating a manufacturing system in accordance with the fifth embodiment of the present invention.

FIG. 23 shows a manufacturing system of micro-structures in accordance with the fifth embodiment of the present invention. The manufacturing system 1 is provided with a film deposition equipment 2A for depositing a thin film on a substrate, an ion implantation device 2C for implanting ions onto a region corresponding to each cross-sectional form of a target micro-structure out of thin films formed by the film deposition equipment 2A, and a lamination equipment 3 for laminating onto a plurality of regions where ions are implanted by surface activated bonding with irradiation of FAB in the vacuum chamber.

Next, operations in the manufacturing system 1 in accordance with the fifth embodiment are described with reference to FIG. 24 and FIG. 25.

FIG. 24(a) through FIG. 24(d) and FIG. 25(a) through FIG. 25(d) are drawings to show the manufacturing processes in accordance with the fifth embodiment.

Figure 24A:
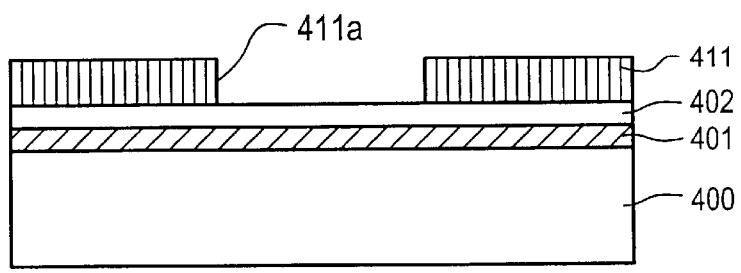
FIGS. 24(a) through (d) are diagrams for showing a manufacturing method in accordance with the fifth embodiment.

As shown in FIG. 24(a), a releasing layer 401 of an $SiO_2$ film is formed on the surface of the substrate of a silicon wafer using the film deposition equipment 2A, and a non-doped polycrystalline Si (poly-Si) thin film 410 is formed thereon by low pressure chemical vapor deposition (LPCVD). Because the final micro-structure is formed from the poly-Si thin film 410, sufficient attention should be paid to the film thickness and film thickness distribution. In this embodiment, the poly-Si thin film 410 with a thickness of 1.0±0.02 µm is formed. An SOI wafer (Silicon On Insulator) may be used instead of the $SiO_2$ film and poly-Si thin film 410 formed on the substrate 400. Next, a silicon nitride film 411 with a thickness of 0.5 µm is formed on the surface of the poly-Si thin film 410 by LPCVD, and a window 411a corresponding to the cross-sectional form of the micro-structure is provided by the conventional photolithigraphy.

Figure 24B:
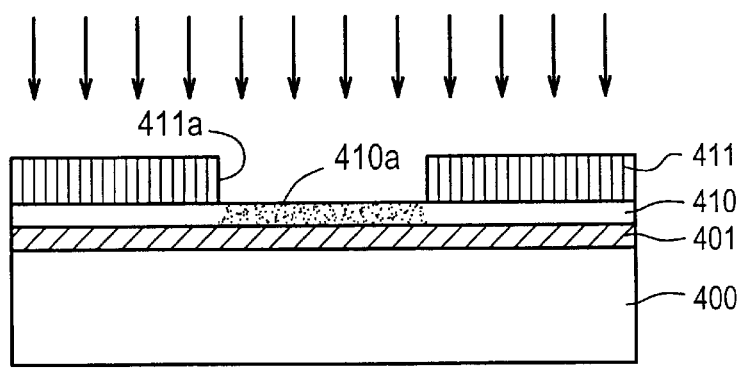

Next, as shown in FIG. 24(b), the substrate 40 is introduced into the ion implantation equipment 2c, boron (B) is implanted up to a high concentration, for example, of 3×10E19 [$cm^{-3}$] or higher. After an implanted mask is removed, annealing is performed in a nitrogen atmosphere to change the ion implanted region to a high concentration $p^+$ Si region 410a namely impurity diffused region, which is served as a latent image.

Figure 24C:
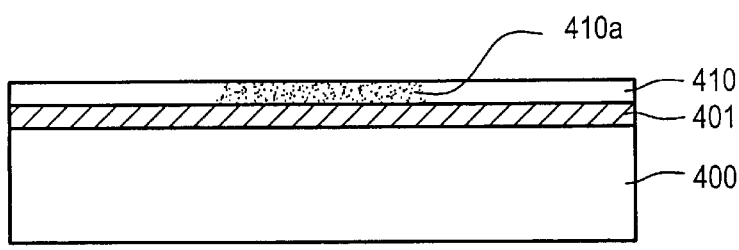

As the result, as shown in FIG. 24(c), the substrate 400 having a structural portion of the micro-structure comprising $p^+$ Si region 410a and a peripheral portion comprising non-doped Si region 410 is completed.

Substrates 400 shown in FIG. 24(c) required to form the micro-structure are prepared by applying the above-mentioned process to thin films corresponding to other cross-sectional forms of the micro-structure.

Figure 24D:
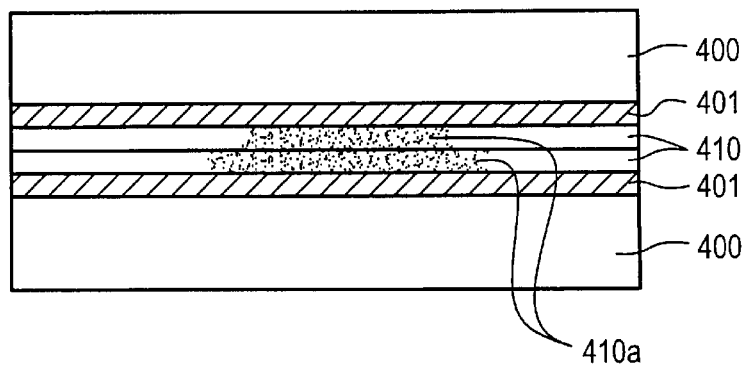
Figure 25A:
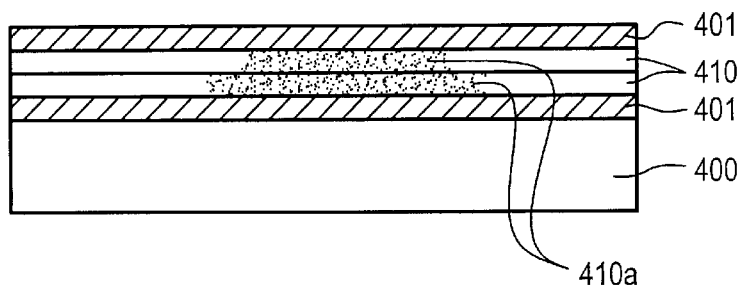
FIGS. 25(a) through (d) are diagrams for showing a manufacturing method in accordance with the fifth embodiment.
Figure 25B:
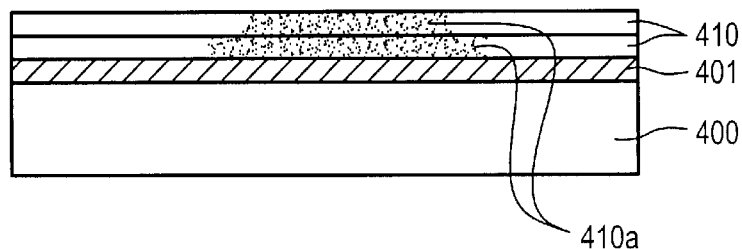
Figure 25C:
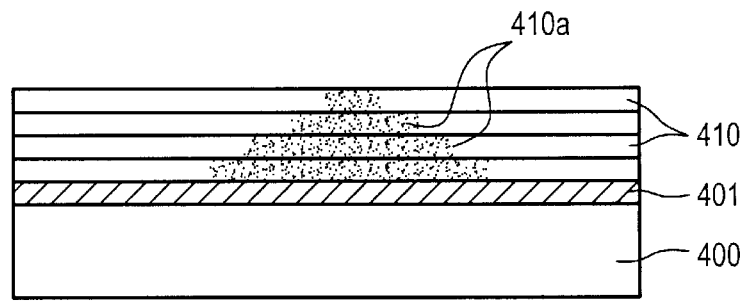
Figure 25D:
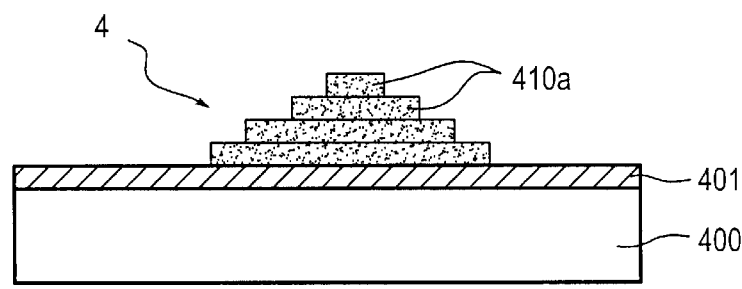
Figure 26:
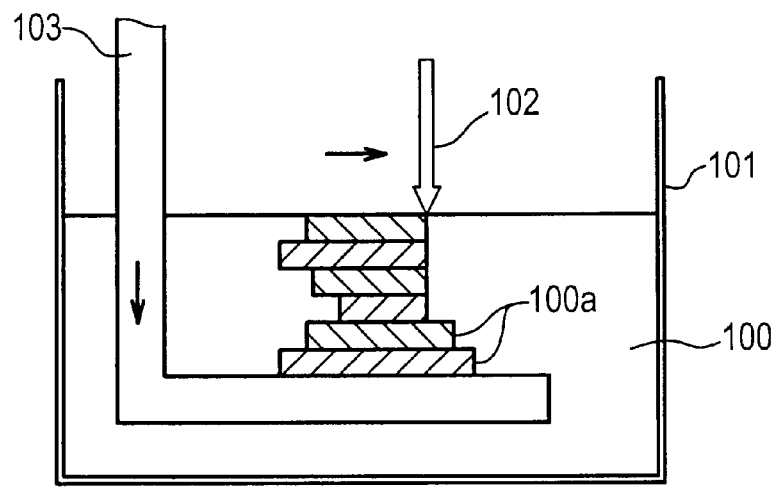
FIG. 26 is a schematic diagram for illustrating the stereolithography of the conventional example 1.
Figure 27:
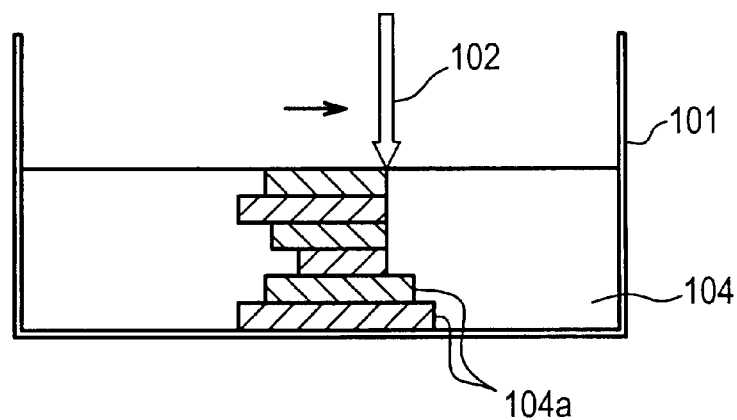
FIG. 27 is a schematic diagram for illustrating the selective laser sintering of the conventional example 2.
Figure 29A:
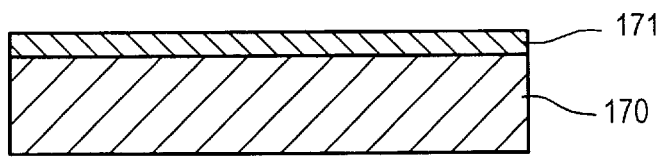
FIGS. 29(a) through (d) show a manufacturing method of the conventional example 4 in which thin films are used as starting material.
Figure 29B:
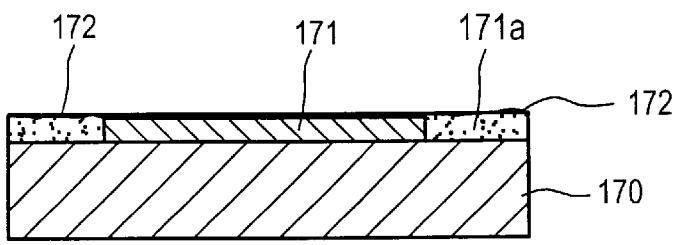
Figure 29C:
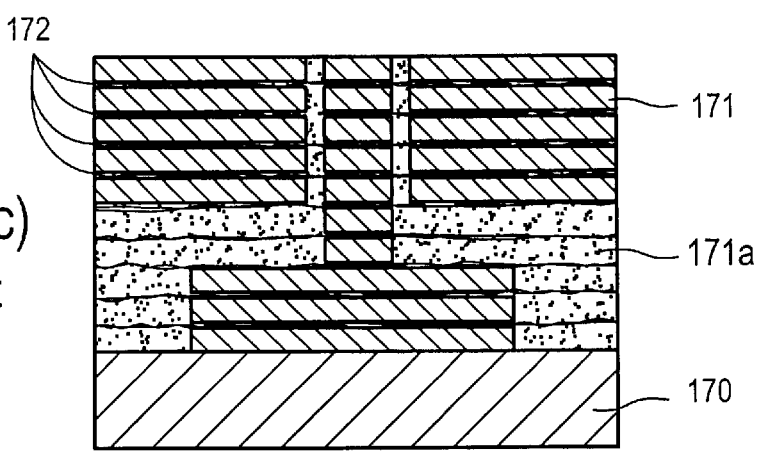
Figure 29D:
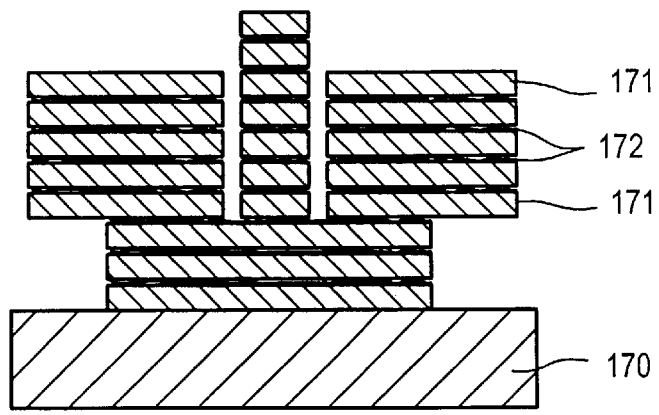

Next, as shown in FIG. 24(d), the substrate 400 on which $p^+$ Si region 410a corresponding to the cross-sectional form of the first layer and the substrate 400 on which $p^+$ Si region 410a corresponding to the cross-sectional form of the second layer are bonded together. In detail, two substrates 400 and 400 are introduced into the vacuum chamber of the lamination equipment 3, the surface is cleaned by FAB irradiation as in the first embodiment, the position of the two substrates 400 and 400 is adjusted, both substrates are bonded together with a pressure, and the substrates 400 and 400 are bonded by surface activated bonding. Alternatively, the conventionally well known wafer bonding may also be applied instead of surface activated bonding. In the "wafer bonding" process, two Si wafers are cleaned sufficiently to make the surface hydrophilic and superimposed, and heat-treated at about 1,000° C. to bond strongly. In this method, because impurity distribution of the region formed by ion implantation is changed due to re-diffusion as the result of the high temperature heat treatment, and the impurity distribution change causes change of the form of the microstructure, it is necessary that the size of the implantation mask pattern is corrected previously for the change. Surface activated bonding by FAB is therefore preferable because such correction is unnecessary.

Next, as shown in FIG. 25(*a*), the back side of the substrate 400 having the surface on which the p$^+$ Si region 410*a* corresponding to the cross-sectional form of the second layer is formed is polished until the releasing layer 401 of SiO$_2$ is exposed. Because the releasing layer 401 can be detected when it is exposed, it is avoided that the Si thin film 410 of the bonding interface is undesirably polished excessively in the polishing process.

Next, as shown in FIG. 25(*b*), the releasing layer 401 is removed by etching with buffered hydrofluoric acid, and a semi-finished product having two laminated Si thin films 410 is completed.

Subsequently, the above-mentioned processes 25(*a*) through 25(*c*) are repeated to form a semi-finished product having as many laminated Si thin films 410 as required.

Next, as shown in FIG. 25(*d*), the Si thin film 410 around the p$^+$ Si region 410*a* is removed by etching with a KOH solution or EDP (ethylenediamine pyrocatechol) solution in the development process. The significant difference of the etching rate between non-doped Si and doped Si to these solutions allows the non-doped Si to be removed selectively. Though not shown in the drawing, the back side of the substrate 400 may be protected with a silicon nitride film, for example. Finally the releasing layer 401 on the substrate 400 is removed by etching with a buffered hydrofluoric acid, then the completed micro-structure 4 is separated from the substrate 400.

According to the fifth embodiment, there are the doped micro-structure structural portion and the non-doped portion surrounding the doped portion both having the same thickness, the surrounding portion functions as a support, an assembled part which has a complex form with an overhang can be therefore formed. The ion-implanted region is formed as a latent image, and the latent image is developed with an EDP solution after lamination, alternatively the latent image forming method and development method other than the above-mentioned methods such as selective exposure of photo-resist and development treatment using a developing solution may be used.

In this embodiment, a silicon nitride film 411 is used as the implanting mask during the ion implanting process, alternatively a silicon oxide film or photo-resist may be used.

Embodiments

Embodiments of the releasing layer to be formed on a substrate surface are described hereinafter.

(Embodiment 1)

Because, by using fluoro polymer (CYTOP, product of Asahi Glass Company) as the releasing layer, a thin layer can be formed on a substrate by spin-coat method, and surface energy is very small (generally very water repellent), the adhesion of the film formed on the surface is very low (about 1 MPa), and the film is suitable as the releasing layer. After spin-coating of a coupling agent (to improve the adhesion on a substrate) on an Si wafer or glass substrate, a film with thickness of about 2 μm of fluoro polymer (CYTOP) is spin-coated and baked at the maximum temperature of 300° C. to form a releasing layer.

(Embodiment 2)

By using fluorinated polyimide (OPI-N1005, product of Hitachi Chemical Co., Ltd.) as the releasing layer a releasing layer can be formed by spin-coat method, and polyimide has a glass transition temperature higher than fluoro polymer (CYTOP), and the maximum temperature of film deposition and patterning process is higher. After coating of a coupling agent, a film with a thickness of about 5 μm of fluorinated polyimide (OPI-N1005) is spin-coated on a substrate, and baked at the maximum temperature of 350° C. to form a releasing layer.

(Embodiment 3)

It is confirmed that a fluorinated surface layer obtained by exposing the substrate surface to a gas containing fluorine atom exhibits the same effect. Specifically, an Si wafer, an Si wafer on which oxide film is formed, or a glass substrate or these substrates coated with non-fluorinated polyimide introduced into a vacuum equipment (dry etching machine), and plasma treatment is applied using CF$_4$ gas (gas flow rate of 100 sccm, discharging power of 500 W, pressure of 10 Pa, and time of 10 minutes), this process results in reduced adhesion strength with the thin film. The same process is also effective using SF$_6$ gas.

As described hereinabove, according to the present invention, because thin films are used as starting material, and a plurality of thin films are laminated by bonding, thus the dimensional precision is high and high resolution in the lamination direction is realized.

Because a micro-structure composed of thin films consisting of a metal or an insulator can be formed, it is possible to manufacture micro-structures directly from a metal or an insulator such as ceramics.

By applying a process in which the first thin film and second thin film are formed with the same film thickness, a plurality of thin films are laminated, and then the first thin film or second thin film is removed selectively, a micro-structure having a plurality of structural elements is formed simultaneously, and thus the steps of the manufacturing and assembling work of micro-structures are significantly reduced.

What is claimed is:

1. An apparatus for manufacturing micro-structures, comprising:
   a vacuum chamber
   a substrate holder in the vacuum chamber, the substrate holder supporting a substrate having a plurality of thin films having a prescribed two-dimensional pattern formed on the substrate;
   a stage disposed facing the substrate holder in the vacuum chamber for supporting a three-dimensional structure formed by laminating the plurality of thin films;
   a moving device that transfers at least one of the substrate holder and the stage to position the stage successively on the plurality of thin films; and a controller that controls the moving device to separate the plurality of thin films from the substrate, to laminate and bond the plurality of thin films on the stage so as to form a micro-structure, wherein the moving device comprises a moving mechanism for moving relatively the substrate holder and the stage at least in three axial directions.

2. The apparatus of claim 1, wherein the vacuum chamber comprises an irradiation source that applies an atomic beam or ion beam onto the surface of the stage to be bonded or to the thin film to clean the surface.

3. The apparatus of claim 1, wherein:
the plurality of thin films includes a plurality of first thin films having a prescribed two-dimensional pattern on the substrate, and a plurality of second thin films composed of different material from that of the first thin films and having the same film thickness as the first thin films disposed around the plurality of first thin films to form a plurality of composite thin films composed of the first thin films and the second thin films; and
the laminate includes the plurality of composite thin films laminated and bonded on the stage.

* * * * *